(12) United States Patent
Yue et al.

(10) Patent No.: US 12,354,702 B2
(45) Date of Patent: Jul. 8, 2025

(54) ZQ CALIBRATION CIRCUIT, OPERATION METHOD, MEMORY AND MEMORY SYSTEM

(71) Applicant: YANGTZE MEMORY TECHNOLOGIES CO., LTD., Wuhan (CN)

(72) Inventors: Huiyuan Yue, Wuhan (CN); Shiyang Yang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 80 days.

(21) Appl. No.: 18/227,264

(22) Filed: Jul. 27, 2023

(65) Prior Publication Data

US 2024/0331743 A1    Oct. 3, 2024

(51) Int. Cl.
*G11C 7/10* (2006.01)
*H03K 19/017* (2006.01)

(52) U.S. Cl.
CPC .......... *G11C 7/1063* (2013.01); *G11C 7/1012* (2013.01); *G11C 7/106* (2013.01); *H03K 19/01721* (2013.01); *G11C 2207/2254* (2013.01)

(58) Field of Classification Search
CPC ..... G11C 7/1063; G11C 7/1012; G11C 7/106; G11C 2207/2254; G11C 7/1057; G11C 7/1084; H03K 19/01721; H03K 19/0005
See application file for complete search history.

(56) References Cited

U.S. PATENT DOCUMENTS

2023/0110208 A1*    4/2023    Lee .................. H01L 25/0652
                                                        365/189.09

* cited by examiner

*Primary Examiner* — Xiaochun L Chen
(74) *Attorney, Agent, or Firm* — BAYES PLLC

(57) ABSTRACT

Implementations of the present disclosure disclose a circuit for ZQ calibration. The circuit may include a logic control circuit. The logic control circuit may include a calibration code generation circuit configured to generate an initial calibration code in response to a calibration command. The logic control circuit may include a mapping conversion circuit configured to control the calibration code generation circuit to convert the initial calibration code to a target calibration code of a target adjustment step size in response to a code adjustment signal. The circuit may further include a calibration circuit configured to calibrate interface impedance of a target semiconductor device based on the target calibration code.

20 Claims, 12 Drawing Sheets

ZQ CALIBRATION CIRCUIT, OPERATION METHOD, MEMORY AND MEMORY SYSTEM

CROSS-REFERENCE TO RELATED APPLICATIONS

This application claims the benefit of priority to Chinese Application No. 202310335228.5, filed on Mar. 28, 2023, which is incorporated herein by reference in its entirety.

TECHNICAL FIELD

The present disclosure relates to the technical field of memory, and particularly to a ZQ calibration circuit, an operation method, a memory and a memory system.

BACKGROUND

Currently, semiconductor memories including integrated circuits such as microprocessors, memory circuits and gate array circuits are used in various electronic apparatuses, such as personal computers, server computers and workstations. With the increase of the operation speed of electronic apparatuses, the impedance mismatch of interface terminals of memories in the electronic apparatuses makes it difficult for electronic apparatuses to deliver data at high speed. Thus, ZQ calibration is introduced into the memories to calibrate the impedance of interface terminals of memories so as to ensure high-speed transmission of data. However, currently-used calibration methods of ZQ calibration circuits are relatively inflexible, and cannot be flexibly applied to different calibration scenarios.

SUMMARY

In view of this, implementations of the present disclosure provide a ZQ calibration circuit, an operation method, a memory and a memory system, which can adjust calibration step sizes in different calibration scenarios to shorten the calibration time or increase the calibration precision.

In a first aspect, implementations of the present disclosure provide a ZQ calibration circuit. The ZQ calibration circuit (e.g., a circuit for ZQ calibration) may include a logic control circuit and a calibration circuit. In some implementations, the logic control circuit may include a calibration code generation circuit and a mapping conversion circuit. In some implementations, the calibration code generation circuit may be configured to generate an initial calibration code in response to a calibration command. In some implementations, the mapping conversion circuit may be configured to control the calibration code generation circuit to convert the initial calibration code to a target calibration code of a target adjustment step size in response to a code adjustment signal. In some implementations, the calibration circuit may be configured to calibrate interface impedance of a target semiconductor device based on the target calibration code.

In the foregoing solution, the code adjustment signal may include a first adjustment sub-signal and/or a second adjustment sub-signal. In some implementations, the mapping conversion circuit may include a first conversion sub-circuit and/or a second conversion sub-circuit. In some implementations, the first conversion sub-circuit may be configured to control the calibration code generation circuit to convert the initial calibration code to a first target calibration code in response to the first adjustment sub-signal. In some implementations, an adjustment step size of the first target calibration code being greater than or equal to an adjustment step size of the initial calibration code. In some implementations, the second conversion sub-circuit may be configured to control the calibration code generation circuit to convert the initial calibration code to a second target calibration code in response to the second adjustment sub-signal, an adjustment step size of the second target calibration code being less than or equal to the adjustment step size of the initial calibration code.

In the foregoing solution, the mapping conversion circuit may include a multiplexer (MUX). In some implementations, the MUX may be configured to control the calibration code generation circuit to convert the initial calibration code to the target calibration code in response to the code adjustment signal. In some implementations, the target calibration code may include a first target calibration code or a second target calibration code. In some implementations, the code adjustment signal may be generated based on a most significant bit of the initial calibration code.

In the foregoing solution, the calibration code generation circuit may include a comparator and a counter. In some implementations, the comparator may be configured to: compare a current voltage across the interface impedance of the target semiconductor device with a reference voltage to generate a comparison result in response to the calibration command; and output the comparison result. In some implementations, the counter may be connected with the comparator and may be configured to receive the comparison result, and generate the initial calibration code according to the comparison result.

In the foregoing solution, the calibration code generation circuit may further include a first flip-flop connected between the comparator and the counter. In some implementations, the first flip-flop may be configured to receive the comparison result and a first clock signal, and sample the comparison result based on the first clock signal and output a control signal. In some implementations, the counter may be further configured to receive the control signal and a second clock signal, and generate the initial calibration code based on the control signal and the second clock signal.

In the foregoing solution, the initial calibration code may include a pull-up calibration code and a pull-down calibration code. In some implementations, the target calibration code may include a pull-up target calibration code and a pull-down target calibration code. In some implementations, the code adjustment signal may include a pull-up code adjustment signal and a pull-down code adjustment signal. In some implementations, the calibration code generation circuit may include a pull-up code generation sub-circuit and a pull-down code generation sub-circuit. In some implementations, the mapping conversion circuit may include a pull-up conversion sub-circuit and a pull-down conversion sub-circuit. In some implementations, the pull-up code generation sub-circuit may be configured to generate the pull-up calibration code in response to the calibration command. In some implementations, the pull-up conversion sub-circuit may be configured to control the pull-up code generation sub-circuit to convert the pull-up calibration code to the pull-up target calibration code in response to the pull-up code adjustment signal. In some implementations, the pull-down code generation sub-circuit may be configured to generate the pull-down calibration code in response to the calibration command. In some implementations, the pull-down conversion sub-circuit may be configured to control the pull-down code generation sub-circuit to convert the pull-down calibration code to the pull-down target calibration code in response to the pull-down code adjustment signal.

In the foregoing solution, the calibration circuit may include a pull-up calibration sub-circuit and a pull-down calibration sub-circuit. In some implementations, the pull-up calibration sub-circuit may be configured to perform pull-up calibration on the interface impedance of the target semiconductor device based on the pull-up target calibration code. In some implementations, the pull-down calibration sub-circuit may be configured to perform pull-down calibration on the interface impedance of the target semiconductor device based on the pull-down target calibration code.

In the foregoing solution, the pull-up calibration sub-circuit may include a pull-up resistor network and a first pull-down resistor network that are connected in series. In some implementations, the pull-down calibration sub-circuit may include a second pull-down resistor network. In some implementations, the pull-up resistor network, the first pull-down resistor network and the second pull-down resistor network may include a plurality of metal oxide semiconductor (MOS) transistors connected in parallel.

In the foregoing solution, the ZQ calibration circuit may further include a code output circuit that is configured to receive a latch command; and output the corresponding target calibration code upon the completion of this calibration based on the latch command. In some implementations, the latch command may be generated when the corresponding target calibration code upon the completion of this calibration is not the same as the corresponding target calibration code upon the completion of a previous calibration.

In the foregoing solution, the code output circuit may include a pull-up code output sub-circuit. In some implementations, the latch command may be a first latch sub-command. In some implementations, the target calibration code may include a pull-up target calibration code. In some implementations, the pull-up code output sub-circuit may include a second flip-flop and a third flip-flop that are connected in series. In some implementations, the second flip-flop may be configured to temporarily store the corresponding pull-up target calibration code upon the completion of this calibration. In some implementations, the third flip-flop may be configured to receive the first latch sub-command, and output the corresponding pull-up target calibration code upon the completion of this calibration based on the first latch sub-command. In some implementations, the first latch sub-command may be generated when the corresponding pull-up target calibration code upon the completion of this calibration is not the same as the corresponding pull-up target calibration code upon the completion of the previous calibration.

In the foregoing solution, the code output circuit may include a pull-down code output sub-circuit. In some implementations, the latch command may include a second latch sub-command. In some implementations, the target calibration code may include a pull-down target calibration code. In some implementations, the pull-down code output sub-circuit may include a fourth flip-flop configured to temporarily store the corresponding pull-down target calibration code upon the completion of this calibration. In some implementations, a fifth flip-flop is configured to receive the second latch sub-command and output the corresponding pull-down target calibration code upon the completion of this calibration based on the second latch sub-command. In some implementations, the second latch sub-command may be generated when the corresponding pull-down target calibration code upon the completion of this calibration is not the same as the corresponding pull-down target calibration code upon the completion of the previous calibration.

In a second aspect, implementations of the present disclosure provide an operation method of a memory. In some implementations, the method may include generating an initial calibration code based on a received calibration command. In some implementations, the method may include converting the initial calibration code to a target calibration code of a target adjustment step size. In some implementations, the method may include calibrating interface impedance of a target semiconductor device based on the target calibration code.

In the foregoing solution, the target calibration code may include a first target calibration code and/or a second target calibration code. In some implementations, an adjustment step size of the first target calibration code may be greater than or equal to an adjustment step size of the initial calibration code. In some implementations, an adjustment step size of the second target calibration code may be less than or equal to the adjustment step size of the initial calibration code.

In the foregoing solution, the converting the initial calibration code to the target calibration code of the target adjustment step size may include generating a code adjustment signal according to a most significant bit of the initial calibration code. In some implementations, the converting the initial calibration code to the target calibration code of the target adjustment step size may include converting the initial calibration code to the target calibration code based on the code adjustment signal. In some implementations, the target calibration code may be a first target calibration code or a second target calibration code.

In the foregoing solution, the generating the initial calibration code based on the received calibration command may include comparing a current voltage with a reference voltage to generate a comparison result in response to the calibration command. In some implementations, the generating the initial calibration code based on the received calibration command may include generating the initial calibration code according to the comparison result. In some implementations, the current voltage may be a current voltage across the interface impedance of the target semiconductor device.

In the foregoing solution, the generating the initial calibration code according to the comparison result may include sampling the comparison result according to a first clock signal to obtain a control signal. In some implementations, the generating the initial calibration code according to the comparison result may include generating the initial calibration code according to the control signal and a second clock signal.

In the foregoing solution, the method may further include receiving a latch command. In some implementations, the method may further include outputting the corresponding target calibration code upon the completion of this calibration based on the latch command. In some implementations, the latch command may be generated when the corresponding target calibration code upon the completion of this calibration is not the same as the corresponding target calibration code upon the completion of a previous calibration.

In the foregoing solution, the target calibration code may include a pull-up target calibration code. In some implementations, the outputting the corresponding target calibration code upon the completion of this calibration based on the latch command may include temporarily storing the corresponding pull-up target calibration code upon the completion of this calibration. In some implementations, the outputting the corresponding target calibration code upon the completion of this calibration based on the latch command may include receiving a first latch sub-command included in the latch command, and outputting the corresponding pull-up target calibration code upon the completion of this calibration based on the first latch sub-command. In some implementations, the first latch sub-command may be generated when the corresponding pull-up target calibration code upon the completion of this calibration is not the same as the corresponding pull-up target calibration code upon the completion of the previous calibration. In the foregoing solution, the target calibration code may include a pull-down target calibration code. In some implementations, the outputting the corresponding target calibration code upon the completion of this calibration based on the latch command may further include temporarily storing the corresponding pull-down target calibration code upon the completion of this calibration. In some implementations, the outputting the corresponding target calibration code upon the completion of this calibration based on the latch command may further include receiving a second latch sub-command included in the latch command. In some implementations, the outputting the corresponding target calibration code upon the completion of this calibration based on the latch command may further include outputting the corresponding pull-down target calibration code upon the completion of this calibration based on the second latch sub-command. In some implementations, the second latch sub-command may be generated when the corresponding pull-down target calibration code upon the completion of this calibration is not the same as the corresponding pull-down target calibration code upon the completion of the previous calibration.

In a third aspect, implementations of the present disclosure provide a memory that includes a memory array configured to store data. In some implementations, the memory may include a peripheral circuit that couples to the memory array and includes a ZQ calibration circuit. In some implementations, the ZQ calibration circuit may include a logic control circuit and a calibration circuit. In some implementations, the logic control circuit may include a calibration code generation circuit and a mapping conversion circuit. In some implementations, the calibration code generation circuit may be configured to generate an initial calibration code in response to a calibration command. In some implementations, the mapping conversion circuit may be configured to control the calibration code generation circuit to convert the initial calibration code to a target calibration code of a target adjustment step size in response to a code adjustment signal. In some implementations, the calibration circuit may be configured to calibrate interface impedance of a target semiconductor device based on the target calibration code.

In the foregoing solution, the memory array may include a three-dimensional "Not AND" (NAND) memory array.

In a fourth aspect, implementations of the present disclosure further provide a memory system. In some implementations, the memory system may include one or more memories, each of which comprises a memory array configured to store data and a peripheral circuit that couples to the memory array and includes a ZQ calibration circuit. In some implementations, the ZQ calibration circuit may include a logic control circuit and a calibration circuit, wherein the logic control circuit comprises a calibration code generation circuit and a mapping conversion circuit. In some implementations, the calibration code generation circuit may be configured to generate an initial calibration code in response to a calibration command. In some implementations, the mapping conversion circuit may be configured to control the calibration code generation circuit to convert the initial calibration code to a target calibration code of a target adjustment step size in response to a code adjustment signal. In some implementations, the calibration circuit may be configured to calibrate interface impedance of a target semiconductor device based on the target calibration code. In some implementations, the memory system may include a memory controller coupled to the one or more memories and configured to control the memories.

In the foregoing solution, the memory system is included in a solid-state drive (SSD) or a memory card.

Implementations of the present disclosure provide a ZQ calibration circuit, an operation method, a memory and a memory system. The ZQ calibration circuit may include a logic control circuit and a calibration circuit. In some implementations, the logic control circuit may include a calibration code generation circuit and a mapping conversion circuit. The calibration code generation circuit may be configured to generate an initial calibration code in response to a calibration command. In some implementations, the mapping conversion circuit may be configured to control the calibration code generation circuit to convert the initial calibration code to a target calibration code of a target adjustment step size in response to a code adjustment signal. The calibration circuit may be configured to calibrate interface impedance of a target semiconductor device based on the target calibration code. The ZQ calibration circuit provided by the implementations of the present disclosure controls, through the mapping conversion circuit, the calibration code generation circuit to convert the initial calibration code to the target calibration code, and the adjustment step size of the target calibration code meets a target adjustment step size, such that the ZQ calibration circuit can be applicable to calibration in different scenarios. Further, if the target adjustment step size becomes larger, the calibration time will be shortened. If the target adjustment step size becomes smaller, the calibration precision will be increased.

BRIEF DESCRIPTION OF THE DRAWINGS

In the drawings not necessarily drawn to scale, the like labels may describe similar components in different views. Like numerals having different letter suffixes may indicate different examples of similar components. The drawings generally illustrate, by way of example, rather than by way of limitation, various implementations discussed in the present document.

DETAILED DESCRIPTION

Figure 1:
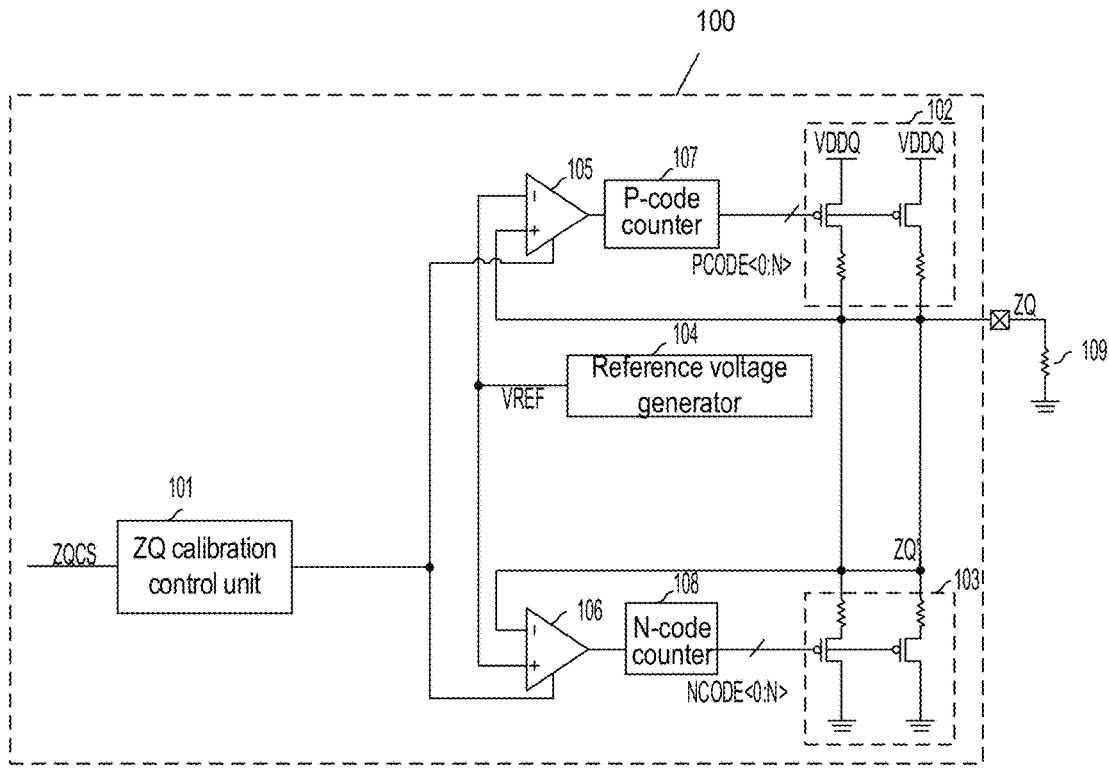
FIG. 1 shows a structural schematic diagram of a ZQ calibration circuit.

Various implementations of the present disclosure are described below in more detail with reference to the drawings. Elements and features in the implementations of the present disclosure may be configured or arranged differently to form other implementations that may serve as variants of any implementation disclosed. Therefore, the implementations of the present disclosure are not limited to the implementations as set forth herein. Instead, the described implementations are provided so that the implementations of the present disclosure are thorough and complete, and fully convey the scope of the implementations of the present disclosure to those skilled in the art to which the implementations of the present disclosure pertain. It is to be noted that references to "an implementation", "another implementation," and the like do not necessarily indicate only one implementation, and different references to any such phrases are not necessarily directed to the same implementation. It should be understood that, although the terms "first", "second", "third" and the like may be used herein to identify various elements, these elements are not limited by these terms. These terms are used to distinguish one element from another element with the same or similar name. Thus, a first element in one implementation may be referred to as a second or third element in another implementation, without departing from the spirit and scope of the implementations of the present disclosure.

The drawings are not necessarily drawn to scale, and in some cases, may be scaled up to clearly illustrate the features of the implementations. When an element is called as being connected or joined to another element, it should be understood that the former may be directly connected or joined to the latter, or electrically connected or electrically joined to the latter via one or more intervening elements therebetween. In addition, it should also be understood that, when an element is referred to as being "between" two elements, it may be the only element between the two elements, or there may also be one or more intervening elements.

The terms used herein are only used for the purpose of describing the specific implementations, and are not intended to limit the present disclosure. As used herein, a singular form is intended to include a plural form, unless the context clearly indicates otherwise. A general designation of the articles "a" and/or "an" as used in the implementations and the appended claims of the present disclosure should be explained as representing "one or more", unless otherwise specified or it may be clearly understood as a singular form from the context. It should be further understood that the terms "comprise", "comprising", "include" and "including" as used in the implementations of the present disclosure specify the presence of the element, and do not preclude the presence or addition of one or more other elements. The term "and/or" as used in the implementations of the present disclosure include any and all combinations of one or more listed associated items. Unless otherwise defined, all terms including technology and scientific technology as used in the implementations of the present disclosure have the same meanings as those generally understood by those of ordinary skill in the art to which the present disclosure pertains in the light of the implementations of the present disclosure. It should be further understood that the terms as defined in common dictionaries should be interpreted as having a meaning that is consistent with their meanings in the context of the implementations of the present disclosure and the related art, and should not be interpreted in an idealized or overly formal sense unless otherwise defined expressly in the implementations of the present disclosure.

In the following description, numerous specific details are set forth to provide a thorough understanding of the present disclosure, and the present disclosure may be practiced without some or all of these specific details. In other cases, processing structures and/or processes are not described in detail to avoid unnecessarily obscuring the present disclosure. It should also be understood that, in some cases, unless otherwise stated particularly, it is apparent to those skilled in the art that a feature or element described with respect to one implementation may be used alone or in combination with other features or elements of another implementation. Hereinafter, various implementations of the present disclosure are described in detail with reference to the drawings. The following description focuses on details to promote the understanding of the implementations of the present disclosure. Conventional technical details may be omitted to avoid obscuring the features and aspects of the implementations of the present disclosure.

A flash memory is a low-cost, high-density, non-volatile firmware storage medium that is electrically erasable and reprogrammable. The flash memory includes a NOR flash memory or a NAND flash memory which are named after a NOR logic gate and a NAND logic gate respectively. The NAND flash memory can make its data bus operate at a double data rate (DDR). In order to ensure the correct transmission of data, a ZQ calibration command is used to calibrate input/output interface impedance of the NAND flash memory, so that the interface impedance meets requirements. Specifically, as shown in FIG. 1, FIG. 1 shows a principle block diagram of a ZQ calibration circuit in the related art. In FIG. 1, the ZQ calibration circuit 100 comprises: a ZQ calibration control unit 101, a pull-up resistor network 102, a pull-down resistor network 103, a reference voltage generator 104, a pull-up comparator 105, a pull-down comparator 106, a P-code counter 107, and an N-code counter 108. That is to say, the ZQ calibration circuit comprises a pull-up calibration branch (e.g., the pull-up resistor network 102, the pull-up comparator 105, the P-code counter 107, etc.) and a pull-down calibration branch (e.g., the pull-down resistor network 103, the pull-down comparator 106, the N-code counter 108, etc.). For the calibration of specific pull-up resistors, a power supply voltage VDDQ is divided by the pull-up resistor network and a reference resistor so as to provide a voltage to a node ZQ. The reference resistor coupled to the node ZQ generally has 240 ohms (Ω). The pull-up comparator compares a voltage at the node ZQ with a reference voltage VREF output from the reference voltage generator so as to generate a pull-up regulation signal. The reference voltage (VREF) is generally set as half of the supply voltage, i.e., VDDQ/2. The P-code counter receives the pull-up regulation signal so as to generate a binary code PCODE<0:N>. The binary code PCODE<0:N> turns on/off MOS transistors coupled in parallel in the pull-up resistor in the pull-up resistor network, thereby calibrating the pull-up resistor since the pull-up resistance value being calibrated has an impact on the voltage at the node ZQ. The above operation is repeated such that the resistance value of the pull-up resistor is equal to the resistance value of the reference resistor 109. During the calibration of the pull-up resistor, the generated binary code PCODE<0:N> is also input to other pull-up resistors in the pull-up resistor network, and the resistance values of the other pull-up resistors are determined.

For pull-down calibration, similar to the pull-up calibration, a binary code NCODE<0:N> is generated by the pull-down comparator and the N-code counter, and a voltage at a node ZQ' becomes equal to the reference voltage (VREF), such that the pull-down resistance in the pull-down resistor network is equal to the pull-up resistance in the pull-up resistor network.

The ZQ calibration control unit in the ZQ calibration circuit receives a short ZQ calibration command (ZQCS, corresponding to short ZQ calibration) or a long ZQ calibration command (ZQCL, corresponding to long ZQ calibration) capable of being issued by a memory controller coupled with the NAND flash memory to compensate for a variation in the input/output interface impedance due to variations in process, voltage, and temperature (PVT). The long ZQ calibration command is typically used during power-on initialization and reset condition of a dynamic random-access memory (DRAM). The short ZQ calibration command tends to be used to track small variations in the voltage and temperature during normal operation, and periodically calibrate the interface impedance while idle, so as to maintain a linear output driver and the interface impedance within the entire voltage and temperature ranges. However, the ZQ calibration circuit used currently is not applicable to different usage scenarios, e.g., such as a usage scenario in which the calibration time is shortened, or calibration precision is improved.

In order to solve the above technical problem, the implementations of the present disclosure provide a ZQ calibration circuit which controls, through a mapping conversion circuit included therein, a calibration code generation circuit to convert an initial calibration code to a target calibration code, wherein an adjustment step size of the target calibration code meets a target adjustment step size, such that the ZQ calibration circuit can be applicable to calibration in different scenarios. Further, if the target adjustment step size becomes larger, the objective of shortening the calibration time will be achieved. If the target adjustment step size becomes smaller, the objective of increasing the calibration precision will be achieved.

The implementations of the present disclosure are further illustrated below in detail in conjunction with the drawings and particular implementations.

Figure 2:
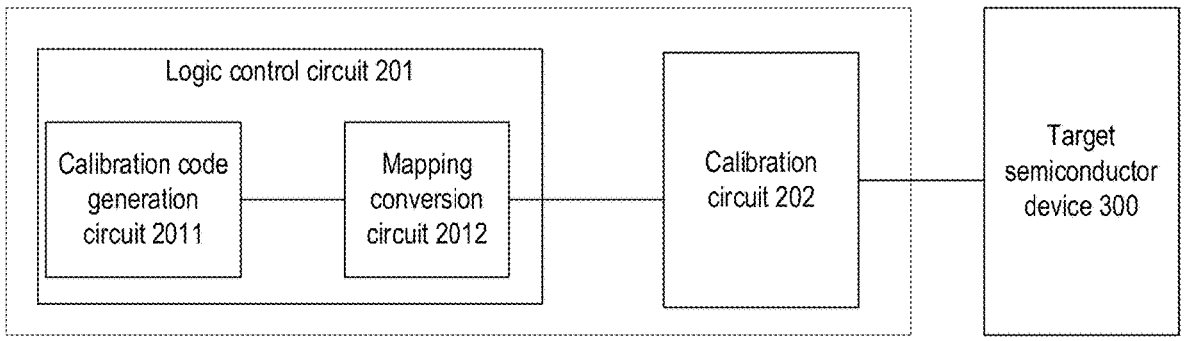
FIG. 2 shows a structural schematic diagram I of a ZQ calibration circuit provided by implementations of the present disclosure.

FIG. 2 shows a structural schematic diagram of a ZQ calibration circuit provided by implementations of the present disclosure. Specifically, as shown in FIG. 2, the ZQ calibration circuit 200 comprises a logic control circuit 201 and a calibration circuit 202, wherein the logic control circuit 201 comprises a calibration code generation circuit 2011 and a mapping conversion circuit 2012, wherein the calibration code generation circuit 2011 is configured to generate an initial calibration code in response to a calibration command, and the mapping conversion circuit is configured to control the calibration code generation circuit to convert the initial calibration code to a target calibration code of a target adjustment step size in response to a code adjustment signal; and the calibration circuit is configured to calibrate interface impedance of a target semiconductor device 300 based on the target calibration code.

It is to be noted that, in ZQ calibration, an expected objective is to use as fewer adjustment steps as possible (adjusting one step size as a step) while obtaining enough resolution. To achieve this expectation, the idea of the implementations of the present disclosure lies in that: in different usage scenarios, the adjustment is made with different adjustment step sizes; for example, in the scenario in which the shortened calibration time is expected, the initial adjustment step size is increased, such that the amplitude per adjustment is larger, thereby shortening the adjustment time. For another example, in the scenario in which the improved calibration precision is expected, the initial adjustment step size is decreased, such that the amplitude per adjustment is smaller, thereby improving the adjustment precision. The ZQ calibration circuit provided by the implementations of the present disclosure controls, through the mapping conversion circuit, the calibration code generation circuit to convert the initial adjustment step size to the target calibration code of the target adjustment step size so as to achieve the objectives of the shortened adjustment time or improved calibration precision. The target semiconductor device may be, but not be limited to, a memory. The solution of achieving the objective of improved calibration precision or the objective of shortened calibration time in the ZQ calibration circuit provided by the implementations of the present disclosure may be applicable to long ZQ calibration and/or short ZQ calibration.

Figure 3:
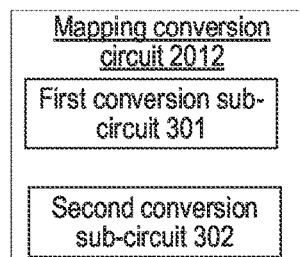
FIG. 3 shows a structural schematic diagram of a mapping conversion circuit 2012 provided by implementations of the present disclosure.

In some implementations, as shown in FIG. 3, the code adjustment signal comprises a first adjustment sub-signal and/or a second adjustment sub-signal. The mapping conversion circuit 2012 comprises a first conversion sub-circuit 301 and/or a second conversion sub-circuit 302. The first conversion sub-circuit 301 is configured to control the calibration code generation circuit 2011 to convert the initial calibration code to a first target calibration code in response to the first adjustment sub-signal, the adjustment step size of the first target calibration code being greater than or equal to the adjustment step size of the initial calibration code. The second conversion sub-circuit 302 is configured to control the calibration code generation circuit 2011 to convert the initial calibration code to a second target calibration code in response to the second adjustment sub-signal, the adjustment step size of the second target calibration code being less than or equal to the adjustment step size of the initial calibration code.

It is to be noted that, here, the scenario to which the first conversion sub-circuit 301 is applicable is: a calibration scenario of shortened adjustment time. Here, the scenario to which the second conversion sub-circuit 302 is applicable is: a calibration scenario of improved calibration precision. In the calibration scenario of the shortened adjustment time, the adjustment step size of the first target calibration code is greater than or equal to the adjustment step size of the initial calibration code. In the calibration scenario of the improved calibration precision, the adjustment step size of the second target calibration code is less than or equal to the adjustment step size of the initial calibration code.

Since the calibration of the interface impedance of the target semiconductor device 300 needs to be completed through multi-step calibration regardless of the calibration scenario of the shortened adjustment time or the calibration scenario of the improved calibration precision, the calibration may be accelerated by increasing the adjustment step size in the calibration scenario of the shortened adjustment time, while the calibration precision also needs to be considered at the same time. That is to say, in the calibration scenario of the shortened adjustment time, the first target calibration code employed by one step, or several steps of calibration is equal to the initial calibration code. Similarly, the calibration also needs to be completed through multi-step calibration in the calibration scenario of the improved calibration precision, and the calibration time also needs to be considered while ensuring the calibration precision. Thus in the calibration scenario of the improved calibration precision, the second target calibration code employed by one step or several steps of calibration is equal to the initial calibration code.

FIG. 3 above only exemplarily exhibits a logic structure of the mapping conversion circuit 2012. In an actual application process, the mapping conversion circuit 2012 may only include the first conversion sub-circuit 301, or only include the second conversion sub-circuit 302, and may also include the first conversion sub-circuit 301 and the second conversion sub-circuit 302 as shown in FIG. 3 above. It is to be noted that, the above only functionally describes that the mapping conversion circuit 2012 includes two conversion sub-circuits, i.e., the first conversion sub-circuit 301 and/or the second conversion sub-circuit 302, to achieve the conversion of the calibration code in the above two different calibration scenarios. Actually, the first conversion sub-circuit 301 and the second conversion sub-circuit 302 may only be one structure in hardware that can achieve the conversion of the calibration code in the above two different calibration scenarios.

Figure 4:
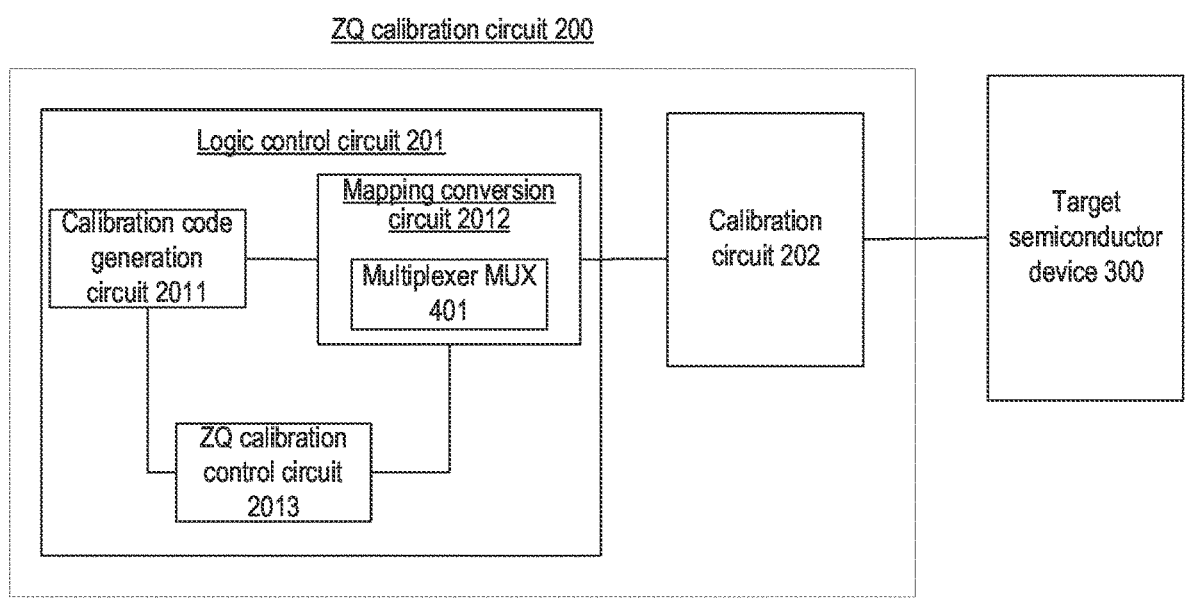
FIG. 4 shows a structural schematic diagram II of a ZQ calibration circuit provided by implementations of the present disclosure.

In some implementations, as shown in FIG. 4, the mapping conversion circuit comprises a MUX 401. The MUX is configured to control the calibration code generation circuit to convert the initial calibration code to the target calibration code in response to the code adjustment signal; the target calibration code comprises a first target calibration code or a second target calibration code; and the code adjustment signal is generated based on a most significant bit of the initial calibration code.

Here, a specific implementation achieving the conversion from the initial calibration code to the target calibration code is described.

In this code conversion method, the MUX receives the code adjustment signal, and controls the calibration code generation circuit 2011 to convert the initial calibration code to the target calibration code in response to the code adjustment signal, wherein the code adjustment signal is generated based on the most significant bit of the initial calibration code.

Specifically, generating the code adjustment signal according to the most significant bit of the initial calibration code may specifically comprise: outputting the code adjustment signal according to the most significant bit of 1 or 0. In an alternative implementation, in the calibration scenario of the shortened adjustment time, when the most significant bit is 1, a first adjustment sub-signal is generated, and under the first adjustment sub-signal, the adjustment step size of the first target calibration code outputted by the calibration code generation circuit controlled by the MUX is greater than the initial calibration code; when the most significant bit is 0, the first adjustment sub-signal is generated, and at this time under the first adjustment sub-signal, the adjustment step size of the first target calibration code outputted by the calibration code generation circuit controlled by the MUX is equal to the initial calibration code. In the calibration scenario of the improved calibration precision, when the most significant bit is 1, a second adjustment sub-signal is generated, and under the second adjustment sub-signal, the adjustment step size of the second target calibration code outputted by the calibration code generation circuit controlled by the MUX is smaller than the initial calibration code; when the most significant bit is 0, the second adjustment sub-signal is generated, and under the second adjustment sub-signal, the adjustment step size of the second target calibration code outputted by the calibration code generation circuit controlled by the MUX is equal to the initial calibration code.

Figure 5:
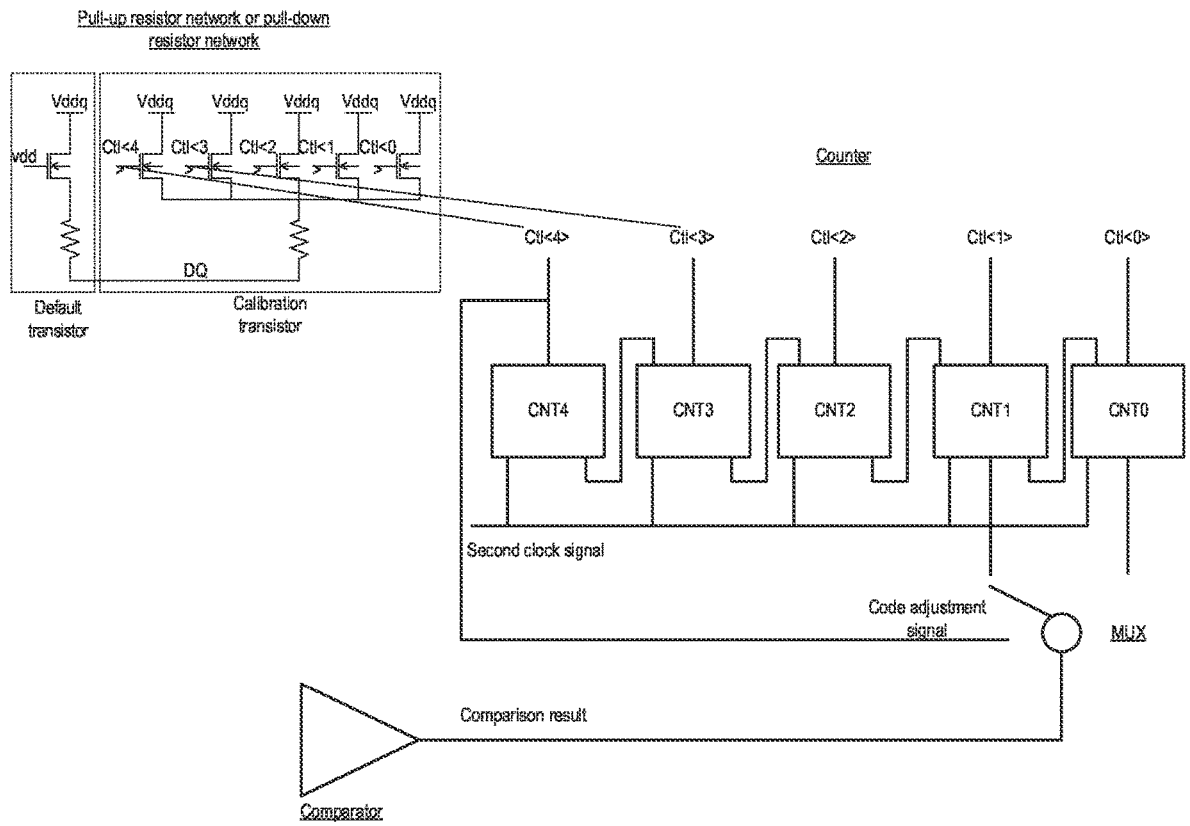
FIG. 5 shows a schematic diagram of the relationship among a MUX, a calibration code generation circuit and a ZQ calibration control circuit in a ZQ calibration circuit when converting an initial calibration code to a target calibration code provided by implementations of the present disclosure.

In order to understand the above-mentioned code conversion process, as shown in FIG. 5, it shows a schematic diagram of the relationship among the MUX, the calibration code generation circuit and the ZQ calibration control circuit in the ZQ calibration circuit when converting the initial calibration code to the target calibration code. In FIG. 5, the counter and the comparator are included in the aforementioned calibration code generation circuit 2011; the MUX is included in the mapping conversion circuit 2012; and the code adjustment signal for controlling the MUX may be directly generated based on the most significant bit of the initial calibration code. That is to say, as shown in FIG. 5, the most significant bit CNT4 of the initial calibration code is directly connected with the MUX, i.e., the most significant bit of the initial calibration code directly controls the MUX. In one of the aforementioned implementations, in the calibration scenario of the shortened adjustment time, when the most significant bit is 1, under the first adjustment sub-signal generated by the ZQ calibration control circuit, the adjustment step size of the first target calibration code outputted by the calibration code generation circuit controlled by the MUX is greater than the initial calibration code. At this time, the MUX selects to connect CNT1 according to the first adjustment sub-signal to merge two adjustment step sizes in the initial calibration code, i.e., the original two-step calibration becomes one-step calibration, thereby accelerating the calibration. When the most significant bit is 0, under the first adjustment sub-signal generated by the ZQ calibration control circuit, the adjustment step size of the first target calibration code outputted by the calibration code generation circuit controlled by the MUX is equal to the initial calibration code. At this time, the MUX selects to connect CNT0 according to the second adjustment sub-signal, such that the adjustment step size of the first target calibration code is equal to the adjustment step size of the initial calibration code.

Based on the relationship schematic diagram as shown in FIG. 5, it is assumed that the initial calibration code includes 6 bits, and in the calibration scenario of the shortened adjustment time, the initial calibration code is converted to the first target calibration code based on the first adjustment sub-signal generated according to the most significant bit, wherein a corresponding relationship between the initial calibration code and the first target calibration code is as shown in Table 1 below.

TABLE 1

Table of the corresponding relationship between the initial calibration code and the first target calibration code

| Initial calibration code | First target calibration code |
|---|---|
| 000000 | 000000 |
| 000001 | 000010 |
| 000010 | |
| 000011 | 000100 |
| 000100 | |
| ... | ... |
| 011111 | 100000 |
| 100000 | |
| 100001 | 100001 |
| 100010 | 100010 |

For the calibration scenario of the improved calibration precision, it is assumed that the initial calibration code includes 5 bits, and in this case, the initial calibration code is converted to the second target calibration code based on the second adjustment sub-signal generated according to the most significant bit, wherein a corresponding relationship between the initial calibration code and the second target calibration code is as shown in Table 2 below.

TABLE 2

Table of the corresponding relationship between the initial calibration code and the second target calibration code

| Initial calibration code | Second target calibration code |
|---|---|
| 01111 | 011110 |
| 10000 | 100000 |
| | 100001 |
| 10001 | 100010 |
| | 100011 |
| ... | ... |

TABLE 2-continued

Table of the corresponding relationship between the initial calibration code and the second target calibration code

| Initial calibration code | Second target calibration code |
|---|---|
| | ... |
| 11110 | 111100 |
| | 111101 |
| 11111 | 111110 |
| | 111111 |

It is to be noted that, the conversion methods in both Tables 1 and 2 above are only exemplary descriptions. In an actual application process, the corresponding relationship between the initial calibration code and the target calibration code is selected according to the actual demands and an actual circuit structure. Moreover, as can be seen from the corresponding relationship between the initial calibration code and the target calibration code as shown in Table 2, there is a need to add additional MOS transistors as low-bit calibration of the interface impedance of the semiconductor device in order to achieve code extension and improve the calibration resolution (or precision).

In some other implementations, as shown in FIG. 4, the logic control circuit 201 further comprises a ZQ calibration control circuit 2013, and the mapping conversion circuit 2012 comprises a MUX 401. The ZQ calibration control circuit 2013 is configured to: generate the code adjustment signal according to the most significant bit of the initial calibration code; and transmit the code adjustment signal to the MUX. The MUX 401 is configured to control the calibration code generation circuit to convert the initial calibration code to the target calibration code in response to the code adjustment signal, the target calibration code comprising a first target calibration code or a second target calibration code.

In this implementation, the ZQ calibration control circuit 2013 in the ZQ calibration control circuit 101 may generate the code adjustment signal according to the most significant bit in the initial calibration code, and provide the code adjustment signal to the MUX; thereafter, the MUX controls the calibration code generation circuit to convert the initial calibration code to the target calibration code based on the code adjustment signal, wherein the target calibration code comprises a first target calibration code when the code adjustment signal comprises a first adjustment sub-signal (the calibration scenario of the shortened adjustment time); and the target calibration code comprises a second target calibration code when the code adjustment signal comprises a second adjustment sub-signal (the calibration scenario of the improved calibration precision).

Generating the code adjustment signal according to the most significant bit of the initial calibration code may specifically comprise: outputting the code adjustment signal according to the most significant bit of 1 or 0. In an alternative implementation, in the calibration scenario of the shortened adjustment time, when the most significant bit is 1, under the first adjustment sub-signal generated by the ZQ calibration control circuit, the adjustment step size of the first target calibration code outputted by the calibration code generation circuit controlled by the MUX is greater than that of the initial calibration code; when the most significant bit is 0, under the first adjustment sub-signal generated by the ZQ calibration control circuit, the adjustment step size of the first target calibration code outputted by the calibration code generation circuit controlled by the MUX is equal to that of the initial calibration code. In the calibration scenario of the improved calibration precision, when the most significant bit is 1, under the second adjustment sub-signal generated by the ZQ calibration control circuit, the adjustment step size of the second target calibration code outputted by the calibration code generation circuit controlled by the MUX is smaller than that of the initial calibration code; when the most significant bit is 0, under the second adjustment sub-signal generated by the ZQ calibration control circuit, the adjustment step size of the second target calibration code outputted by the calibration code generation circuit controlled by the MUX is equal to that of the initial calibration code.

It is to be noted that, FIG. 5 does not show the ZQ calibration control circuit, i.e., does not show a process that the ZQ calibration control circuit generates the code adjustment signal according to the most significant bit of the initial calibration code. At this time, the control for the MUX is the same, which is not repeated here.

Figure 6:
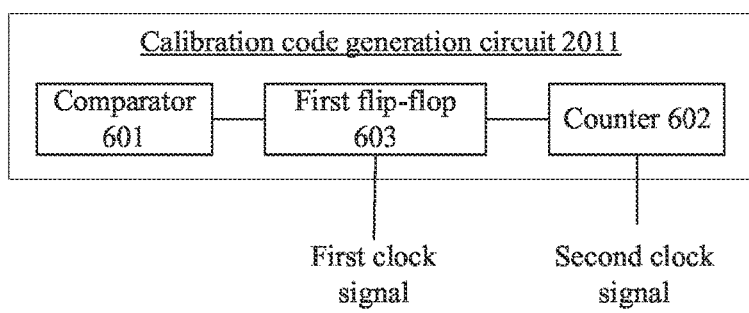
FIG. 6 shows a structural schematic diagram of a calibration code generation circuit 2011 provided by implementations of the present disclosure.

In some implementations, as shown in FIG. 6, the calibration code generation circuit 2011 comprises a comparator 601 and a counter 602. The comparator 601 is configured to: compare a current voltage across the interface impedance of the target semiconductor device with the reference voltage to generate a comparison result; and output the comparison result. The counter 602 is configured to receive the comparison result, and generate the initial calibration code according to the comparison result.

It is to be noted that the current voltage is a voltage across the interface impedance of the target semiconductor device. That is to say, the comparison by the comparator 601 is a comparison between the reference voltage and a voltage value across the interface impedance of the target semiconductor device under the current calibration cycle (or calibration of a current step), and the comparator 601 outputs the comparison result to the counter 602; and the counter 602 generates the initial calibration code according to the comparison result.

In some implementations, as shown in FIG. 6, the calibration code generation circuit 2011 may further comprise a first flip-flop 603 connected between the comparator 601 and the counter 602. The first flip-flop 603 is configured to receive the comparison result and a first clock signal, and sample the comparison result based on the first clock signal and output a control signal. The counter 602 is further configured to receive the control signal and a second clock signal, and generate the initial calibration code based on the control signal and the second clock signal.

It is to be noted that, the function of the first flip-flop 603 here is to obtain a relatively stable comparison result. As an alternative implementation, the first flip-flop 603 may be a D flip-flop (DFF). The DFF is an information storage component having a memory function and two stable states; and its triggering methods include both a level triggering and an edge triggering, wherein the former may be triggered when a CP (clock pulse)=1, and the latter is mostly triggered at a front edge (positive jump 0→1) of the CP. The triggering method of the first flip-flop 603 provided by the implementations of the present disclosure may be edge triggering. That is, when the edge of the first clock signal arrives, the comparison result is sampled. Since the output of the DFF will change only when the control signal changes, the first flip-flop is utilized to sample the comparison result to obtain a relatively stable control signal.

Then, the counter 602 generates the initial calibration code (such as the aforementioned PCODE<0:N> and/or NCODE<0:N>) according to the second clock signal and the control signal. Here, the "first" and "second" of the first clock signal and the second clock signal are employed only for facilitating description of two clock signals in two different processes, do not have a direct relationship, and cannot be understood as a limitation to the first clock signal and the second clock signal.

It is to be noted that the structure of the ZQ calibration circuit as shown in aforementioned FIGS. 1 to 6 only describes in detail the technical solution provided by the implementations of the present disclosure in principle. In an actual application process, the ZQ calibration circuit should be divided into pull-up calibration and pull-down calibration.

Figure 7:
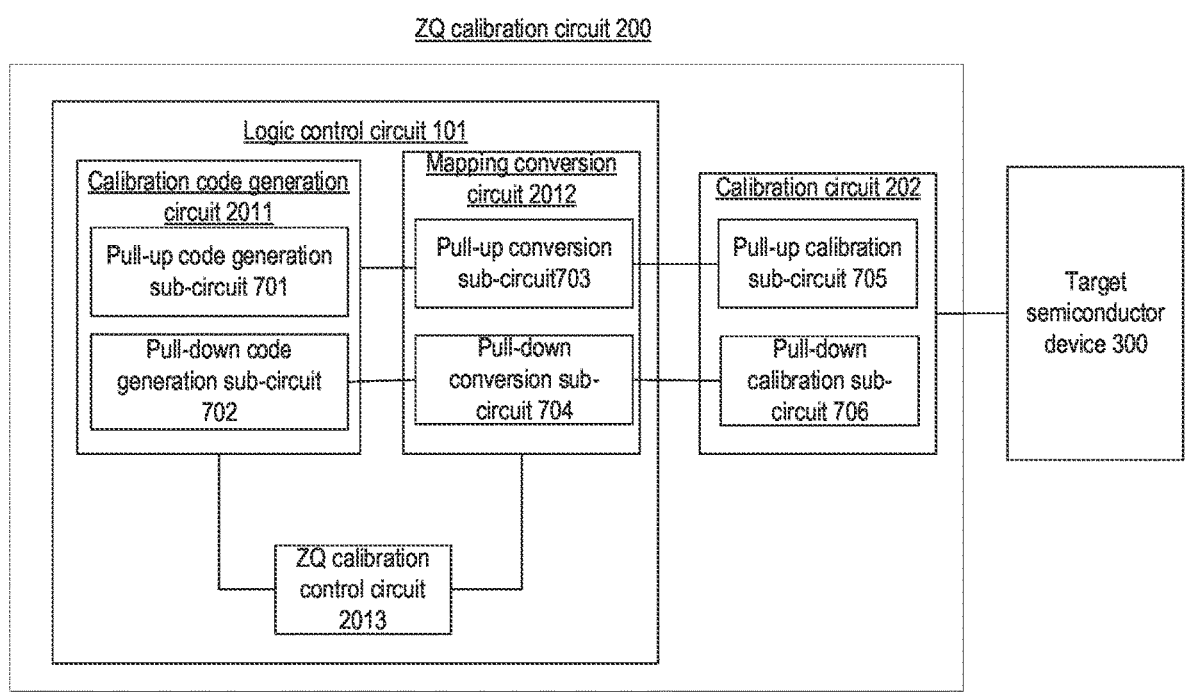
FIG. 7 shows a structural schematic diagram III of a ZQ calibration circuit provided by implementations of the present disclosure.

Specifically, in some implementations, as shown in FIG. 7, the initial calibration code comprises a pull-up calibration code and a pull-down calibration code; the target calibration code comprises a pull-up target calibration code and a pull-down target calibration code; the calibration code generation circuit 2011 comprises a pull-up code generation sub-circuit 701 and a pull-down code generation sub-circuit 702; and the mapping conversion circuit comprises a pull-up conversion sub-circuit 703 and a pull-down conversion sub-circuit 704. The pull-up code generation sub-circuit 701 is configured to generate the pull-up calibration code in response to the calibration command. The pull-up conversion sub-circuit 703 is configured to control the pull-up code generation sub-circuit to convert the pull-up calibration code to the pull-up target calibration code in response to the pull-up code adjustment signal. The pull-down code generation sub-circuit 702 is configured to generate the pull-down calibration code in response to the calibration command. The pull-down conversion sub-circuit 704 is configured to control the pull-down code generation sub-circuit to convert the pull-down calibration code to the pull-down target calibration code in response to the pull-down code adjustment signal.

It is to be noted that, the ZQ calibration comprises pull-up calibration and pull-down calibration; correspondingly, the initial calibration code comprises a pull-up calibration code and a pull-down calibration code; the target calibration code comprises a pull-up target calibration code and a pull-down target calibration code; the calibration code generation circuit 2011 comprises a pull-up code generation sub-circuit 701 and a pull-down code generation sub-circuit 702; and the mapping conversion circuit comprises a pull-up conversion sub-circuit 703 and a pull-down conversion sub-circuit 704. The operating principles of the pull-up code generation sub-circuit 701 and the pull-down code generation sub-circuit 702 in the pull-up calibration branch and the pull-down calibration branch are similar, and both the pull-up code generation sub-circuit 701 and the pull-down code generation sub-circuit 702 can achieve their functions with the structure of FIG. 6 above, and the difference between them is that: the pull-up code generation sub-circuit 701 generates the pull-up calibration code; and the pull-down code generation sub-circuit 702 generates the pull-down calibration code. The operating principles of the pull-up conversion sub-circuit and the pull-down conversion sub-circuit in the mapping conversion circuit are also similar, and both the pull-up conversion sub-circuit and the pull-down conversion sub-circuit can achieve their functions with the structures as shown in FIGS. 3 and 4 above, and the difference between them is that: the pull-up conversion sub-circuit 703 controls the pull-up code generation sub-circuit to convert the pull-up calibration code to the pull-up target calibration code in response to the pull-up code adjustment signal; and the pull-down conversion sub-circuit 704 controls the pull-down code generation sub-circuit to convert the pull-down calibration code to the pull-down target calibration code in response to the pull-down code adjustment signal.

Correspondingly, in some implementations, as shown in FIG. 7, the calibration circuit 202 comprises a pull-up calibration sub-circuit 705 and a pull-down calibration sub-circuit 706. The pull-up calibration sub-circuit 705 is configured to perform pull-up calibration on the interface impedance of the target semiconductor device based on the pull-up target calibration code. The pull-down calibration sub-circuit 706 is configured to perform pull-down calibration on the interface impedance of the target semiconductor device based on the pull-down target calibration code.

Figure 8:
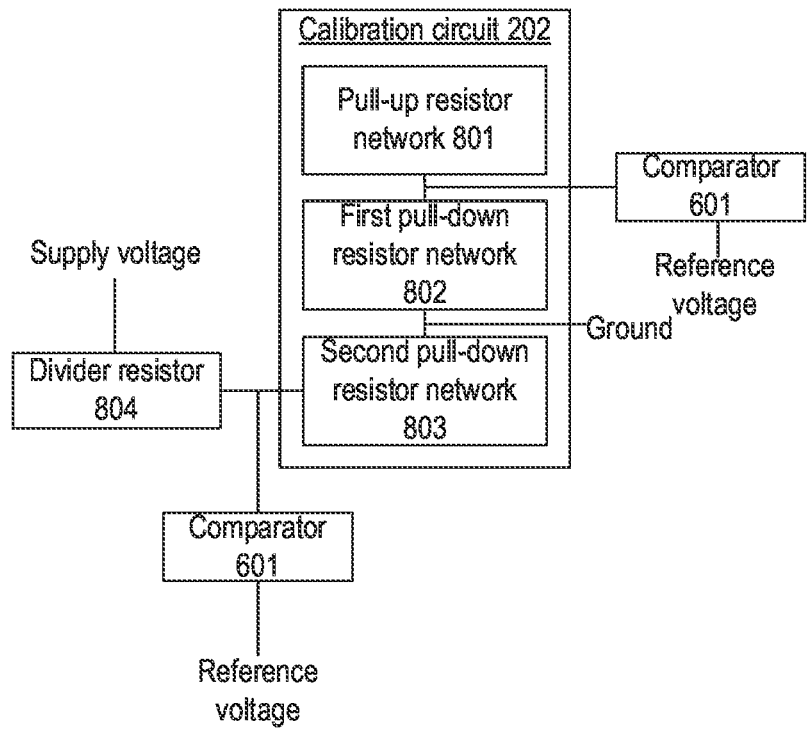
FIG. 8 shows a structural schematic diagram of a pull-up calibration sub-circuit and a pull-down calibration sub-circuit provided by implementations of the present disclosure.

As shown in FIG. 8, the pull-up calibration sub-circuit 705 comprises a pull-up resistor network 801 and a first pull-down resistor network 802 that are connected in series; and the pull-down calibration sub-circuit 706 comprises a second pull-down resistor network 803. The pull-up resistor network, the first pull-down resistor network and the second pull-down resistor network comprise a plurality of metal oxide semiconductor MOS transistors connected in parallel.

Figure 9:
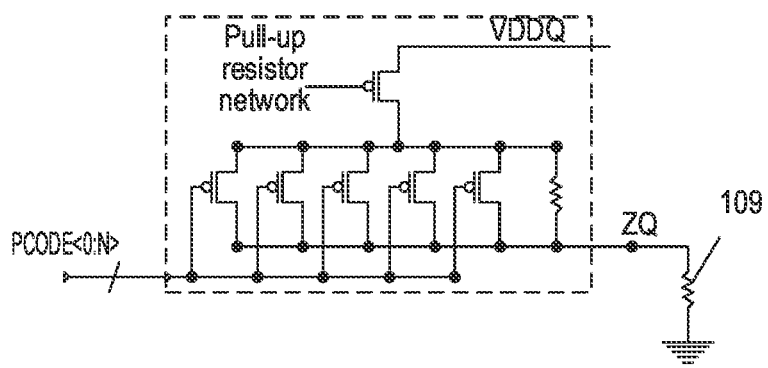
FIG. 9 is a structural schematic diagram of a pull-up resistor network provided by implementations of the present disclosure.
Figure 10:
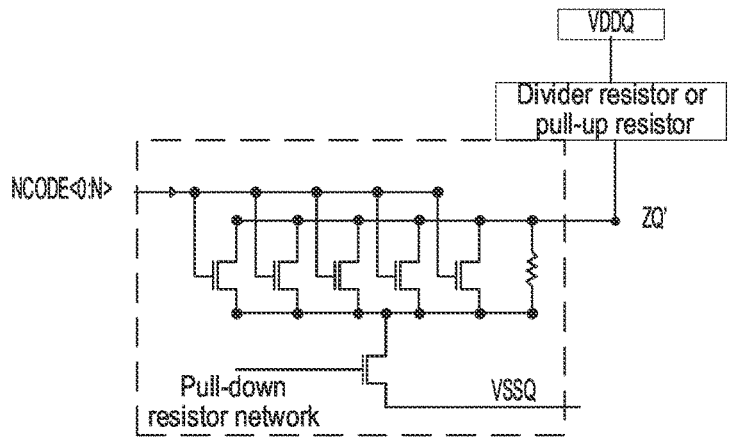
FIG. 10 shows a structural schematic diagram of a first pull-down resistor network and a second pull-down resistor network provided by implementations of the present disclosure.

Specifically, as shown in FIG. 9, the pull-up resistor network 801 includes a plurality of MOS transistors connected in parallel. As shown in FIG. 10, the first pull-down resistor network 802 and the second pull-down resistor network 803 comprise a plurality of MOS transistors connected in parallel. The numbers of the MOS transistors connected in parallel included in the pull-up resistor network 801 and the first pull-down resistor network 802 are equal, and two corresponding MOS transistors are connected in series; one end of a comparator 601 (a pull-up comparator) included in the pull-up code generation sub-circuit of the calibration code generation circuit 2011 is connected at its series connection point; the pull-up comparator receives a voltage (the current voltage of the pull-up calibration) across the interface impedance of the target semiconductor device in the pull-up calibration; and the other end of the pull-up comparator is connected with the reference voltage. The numbers of the MOS transistors connected in parallel included in the second pull-down resistor network 803, the pull-up resistor network 801 and the first pull-down resistor network 802 are equal, and the MOS transistors in the second pull-down resistor network 803 are connected with a supply voltage VDDQ (or Vddq) at one end through a divider resistor 804 and grounded to VSS at the other end. One end of a comparator 601 (a pull-down comparator) included in the pull-down generation sub-circuit is connected to a connection line between the divider resistor 804 and the second pull-down resistor network 803, and the pull-down comparator receives a voltage (the current voltage of the pull-down calibration) across the interface impedance of the target semiconductor device in the pull-down calibration, and the other end of the pull-down comparator is connected with the reference voltage. The reference voltages in the pull-up calibration and the pull-down calibration may be the same, and may also be different. It is to be noted that the first pull-down resistor network 802 is connected at one end through pull-up resistors in the pull-up resistor network, and is grounded at the other end, and its structure is also as shown in FIG. 10.

Figure 11:
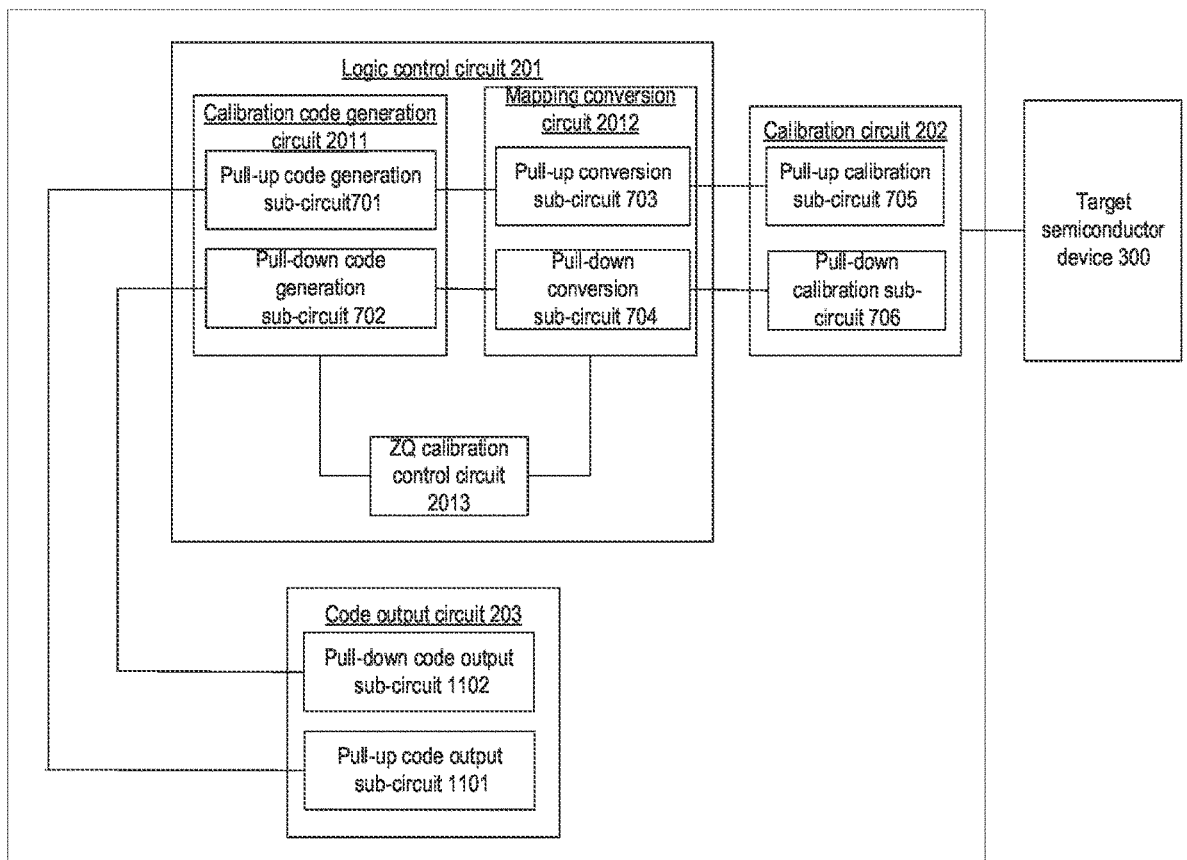
FIG. 11 shows a structural schematic diagram IV of a ZQ calibration circuit provided by implementations of the present disclosure.

In some implementations, as shown in FIG. 11, the ZQ calibration circuit 200 further comprises a code output circuit 203 that is configured to: receive a latch command; and output the corresponding target calibration code upon the completion of this calibration based on the latch command, wherein the latch command is generated when the corresponding target calibration code upon the completion of this calibration is not the same as the corresponding target calibration code upon the completion of a previous calibration.

It is to be noted that, the ZQ calibration circuit provided by the implementations of the present disclosure further comprises a code output circuit which functions to output the corresponding target calibration code upon the completion of this calibration based on the latch command after receiving the latch command. The completion of this calibration may refer to completion of both this pull-up calibration and pull-down calibration. The completion of the pull-up calibration and the completion of the pull-down calibration as described here may refer to a situation in which the interface impedance of the target semiconductor device meets requirements. The resistance value of the pull-up resistor network under the impact of the pull-up target calibration code is equal to, such as, a reference resistor value associated with the aforementioned reference resistance 109 in FIG. 1; the resistance value of the second pull-down resistor network under the impact of the pull-down target calibration code is equal to the reference resistance value associated with reference resistor 109, that is, the pull-up calibration is completed and the pull-down calibration is completed, which is also a situation that the interface impedance of the target semiconductor device meets the requirements.

Here, the latch command may be generated when the ZQ calibration control circuit determines that the corresponding target calibration code upon the completion of this calibration is not the same as the corresponding target calibration code upon the completion of the previous calibration, and is outputted to the code output circuit so as to update and store the latest target calibration code for later use. That is to say, if the corresponding target calibration code upon the completion of this calibration is the same as the corresponding target calibration code upon the completion of the previous calibration, there is no need to waste one output, such that some calibration time can be saved.

Based on the aforementioned ZQ calibration comprising the pull-up calibration and the pull-down calibration, correspondingly, as shown in FIG. 11, the code output circuit 203 comprises a pull-up code output sub-circuit 1101; and the latch command comprises a first latch sub-command. The pull-up code output sub-circuit 1101 comprises a second flip-flop and a third flip-flop that are connected in series; the second flip-flop is configured to temporarily store the corresponding pull-up target calibration code upon the completion of this calibration; and the third flip-flop is configured to receive the first latch sub-command and output the corresponding pull-up target calibration code upon the completion of this calibration based on the first latch sub-command, wherein the first latch sub-command is generated when the corresponding pull-up target calibration code upon the completion of this calibration is not the same as the corresponding pull-up target calibration code upon the completion of the previous calibration.

It is to be noted that, the timing for restorage of the pull-up target calibration code may be that: when the corresponding pull-up target calibration code upon the completion of this calibration is not the same as the corresponding pull-up target calibration code upon the completion of the previous calibration, the corresponding pull-up target calibration code upon the completion of this pull-up calibration is transmitted and stored.

In some implementations, the code output circuit 203 comprises a pull-down code output sub-circuit 1102; and the latch command comprises a second latch sub-command. The pull-down code output sub-circuit comprises: a fourth flip-flop configured to temporarily store the corresponding pull-down target calibration code upon the completion of this calibration, and a fifth flip-flop configured to receive the second latch sub-command and output the corresponding pull-down target calibration code upon the completion of this calibration based on the second latch sub-command, wherein the second latch sub-command is generated when the corresponding pull-down target calibration code upon the completion of this calibration is not the same as the corresponding pull-down target calibration code upon the completion of the previous calibration.

It is to be noted that, the timing for the restorage of the pull-down target calibration code may be that: when the corresponding pull-down target calibration code upon the completion of this calibration is not the same, the corresponding pull-down target calibration code upon the completion of this pull-down calibration is transmitted and stored.

Figure 12:
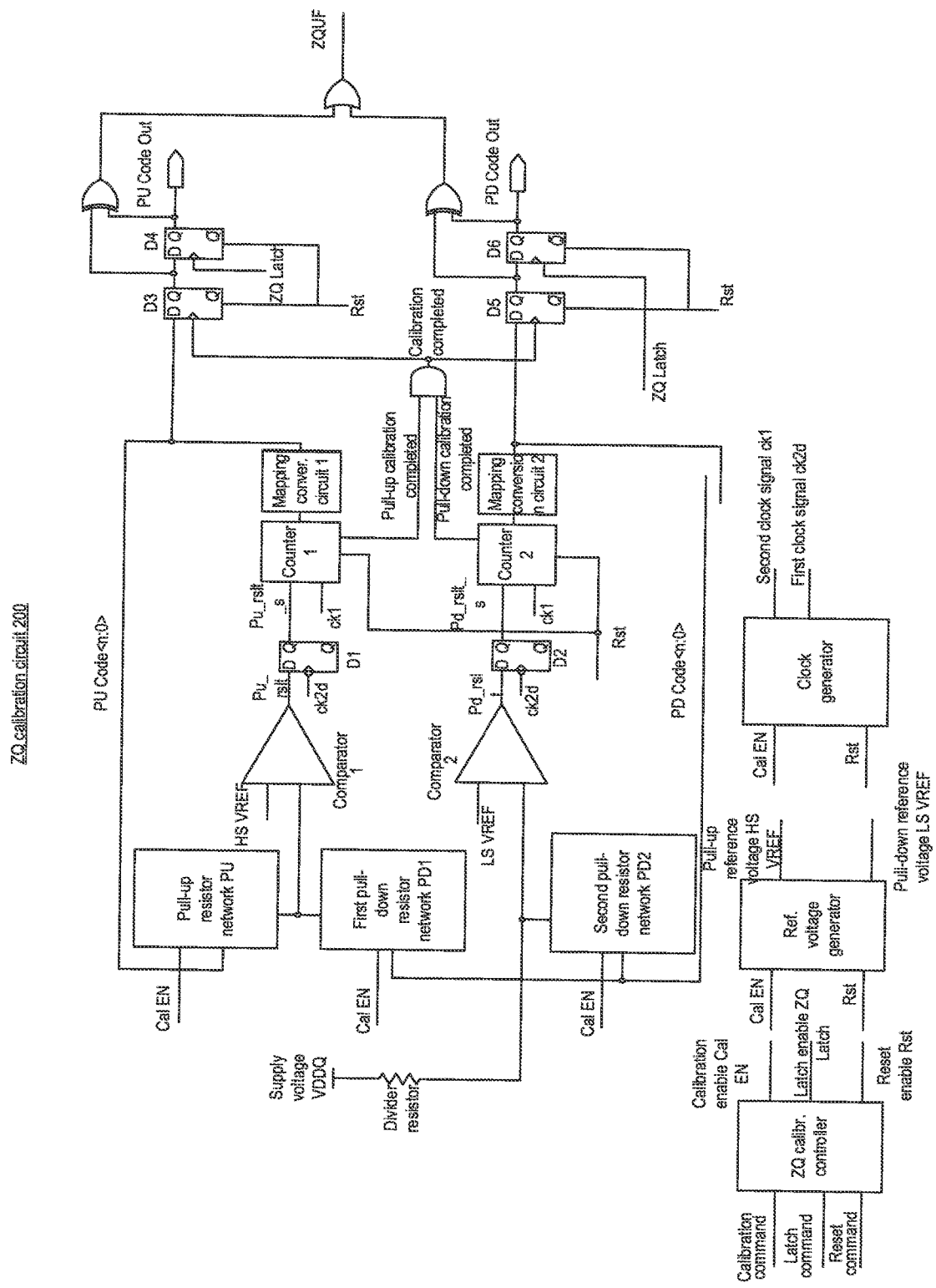
FIG. 12 shows a complete structural schematic diagram of a ZQ calibration circuit provided by implementations of the present disclosure.
Figure 13:
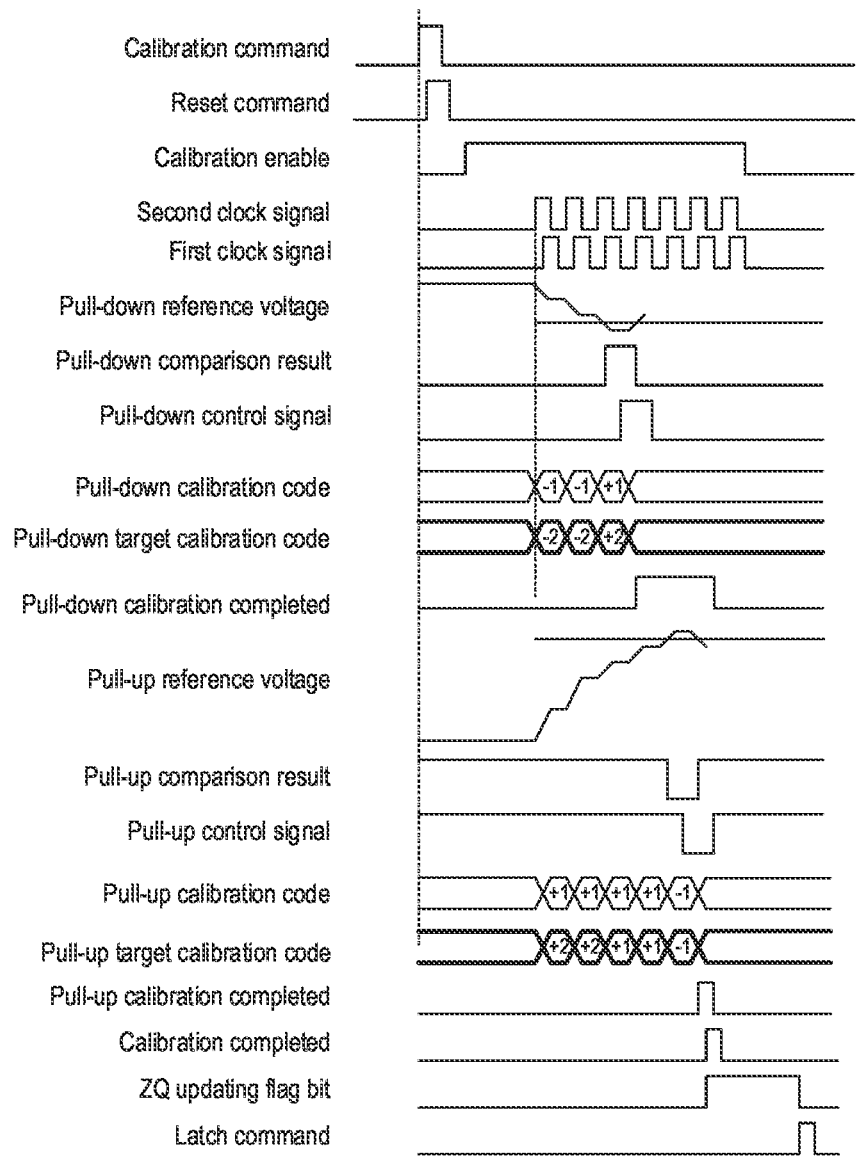
FIG. 13 shows a work sequence diagram of the ZQ calibration circuit as shown in FIG. 12 provided by implementations of the present disclosure.

To understand the implementations of the present disclosure, as shown in FIGS. 12 to 13, FIG. 12 shows a relatively complete circuit structural schematic diagram of a ZQ calibration circuit 200 provided by implementations of the present disclosure, and FIG. 13 shows a work sequence diagram based on the ZQ calibration circuit of FIG. 12.

In FIG. 12, a ZQ calibration controller is an example of the ZQ calibration control circuit 2013 in the aforementioned logic control circuit 201. The ZQ calibration controller receives the calibration command, and generates calibration enable (signal) Cal EN based on the calibration command; the ZQ calibration controller may also receive the latch command, and generate latch enable (signal) ZQ Latch based on the latch command; and the ZQ calibration controller may further receive a reset command, and generate reset enable signal (Rst) based on the reset command. Various commands received by the ZQ calibration controller are transmitted by a memory controller included in a memory system to which the ZT calibration circuit belongs.

The comparator 1, the counter 1 and the mapping conversion circuit 1 correspond to the pull-up comparator, the pull-up counter and the pull-up conversion sub-circuit in the aforementioned pull-up calibration; and the comparator 2, the counter 2 and the mapping conversion circuit 2 correspond to the pull-down comparator, the pull-down counter and the pull-down conversion sub-circuit in the aforementioned pull-down calibration. D1 and D2 correspond to the aforementioned first flip-flop; D3 and D4 correspond to the second flip-flop and the third flip-flop respectively; and D5 and D6 correspond to the third flip-flop and the fourth flip-flop respectively. Pu_rslt is the pull-up comparison result; Pu_rslt_s is the pull-up control signal; Pd_rslt is the pull-down comparison result; and Pd_rslt_s is the pull-down control signal.

Based on FIG. 12, in conjunction with the sequence diagram of FIG. 13, the operating principle of the ZQ calibration circuit provided by the implementations of the present disclosure is as follows: for the pull-up calibration, the memory controller transmits the calibration command, and the ZQ calibration controller receives the calibration command and generates the calibration enable (signal) Cal EN based on the calibration command; the ZQ calibration circuit provided by the implementations of the present disclosure enables calibration based on the calibration enable (signal) Cal EN, and its specific work procedure is similar to the description in aforementioned FIG. 1, with an exception that: the pull-up calibration code is converted to the pull-up target calibration code PU Code<n:0> by the mapping conversion circuit 1; then, the pull-up target calibration code is applied to the pull-up resistor network PU that performs the calibration on the interface impedance of the target semiconductor device until the pull-up resistance in the pull-up resistor network is equal to the reference resistance value such as that in FIG. 1, thus completing the pull-up calibration of the interface impedance of the target semiconductor device. Similarly, the pull-down calibration is also such a process. The pull-down calibration code is converted to the pull-down target calibration code PD Code<n:0> by the mapping conversion circuit 2, and the pull-down calibration is completed with the pull-down target calibration code PD Code<n:0>, and the specific process is no longer repeated here. After the pull-up calibration and the pull-down calibration are completed, if the target calibration code (the pull-up target calibration code and the pull-down target calibration code) obtained by this calibration is different from the aforementioned target calibration code, a ZQ updating flag bit ZQUF may also be set; the memory controller transmits the latch command to the ZQ calibration controller according to a state of the ZQ updating flag bit that is a set state; the ZQ calibration controller generates the latch enable (signal) ZQ Latch based on the latch command; D3 and D4 act together to output the pull-up target calibration code obtained by this calibration; and D5 and D6 act together to output the pull-down target calibration code obtained by this calibration for later use. After the ZQ calibration is completed and the target calibration code is stored, the ZQ calibration controller may also receive the reset command, and receives the reset enable signal (Rst) based on the reset command so as to reset the ZQ calibration circuit.

The implementations of the present disclosure provide a ZQ calibration circuit which controls, through the mapping conversion circuit, the calibration code generation circuit to convert the initial calibration code to the target calibration code, wherein the adjustment step size of the target calibration code meets the target adjustment step size, such that the ZQ calibration circuit is applicable to calibration in different scenarios. Further, if the target adjustment step size becomes larger, the calibration time will be shortened. If the target adjustment step size becomes smaller, the calibration precision will be increased.

Figure 14:
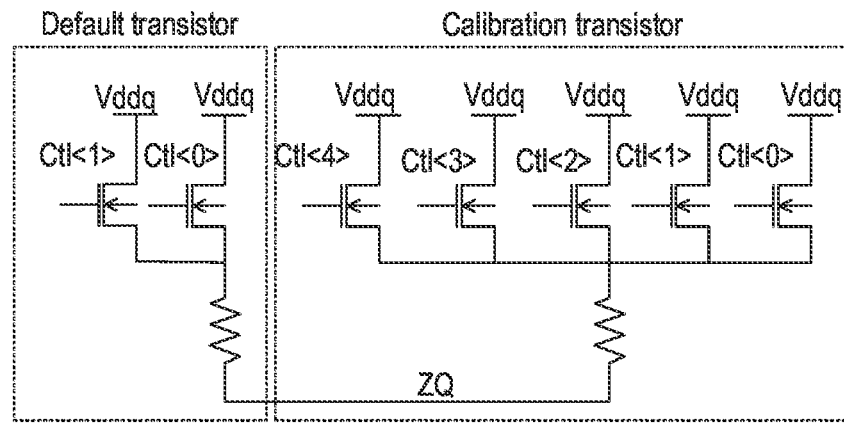
FIG. 14 shows a structural schematic diagram of a pull-up resistor network or a pull-down resistor network in a ZQ calibration circuit in parallel to FIG. 2, provided by implementations of the present disclosure.

In an actual application process, there is also a technical solution capable of achieving usage of as few adjustment steps as possible (adjusting one step size as a step) while obtaining the enough resolution in parallel to the solution of FIG. 2. Specifically, as shown in FIG. 14, without converting the calibration code through the mapping conversion circuit, a default transistor is added to the original pull-up resistor network and pull-down resistor network as shown in FIG. 5 so as to adjust the adjustment step size of the calibration code, thus the step size can be adjusted in different scenarios. It is to be noted that, in an actual application process, this manner requires, in hardware, adding a default transistor to each die in the memory array included in the memory.

Figure 15:
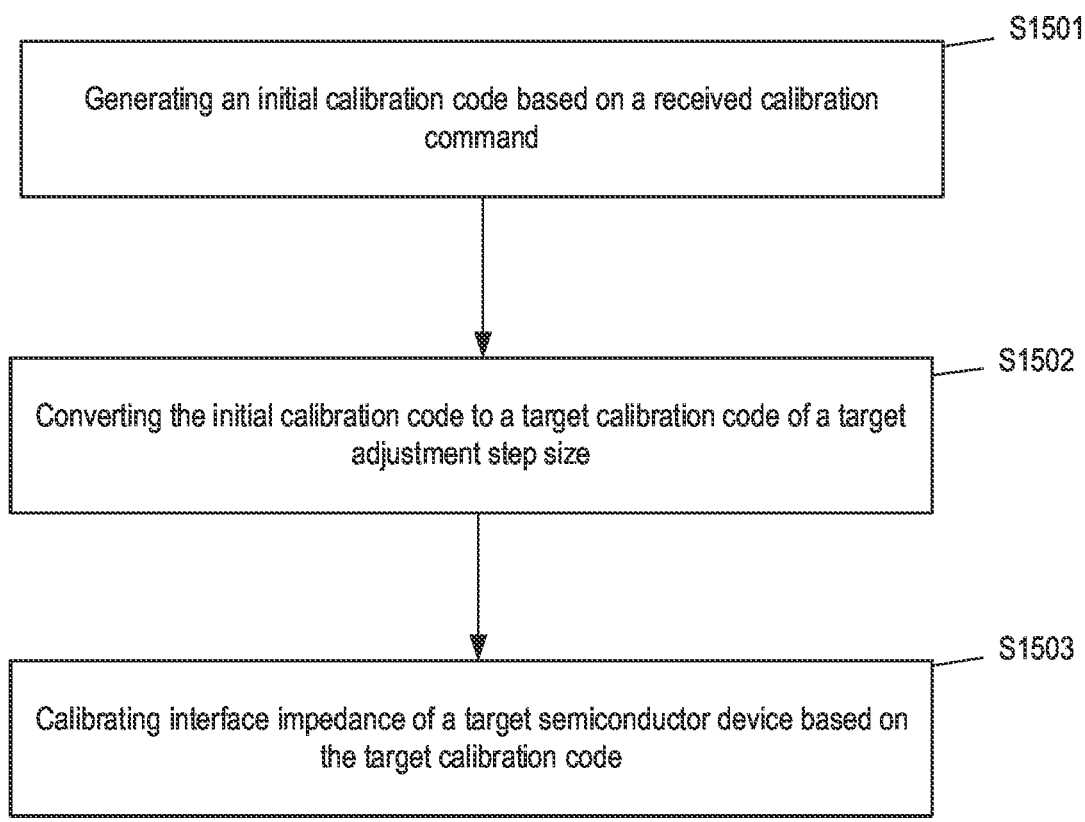
FIG. 15 shows a flow diagram of an operation method of a memory provided by implementations of the present disclosure.

Implementations of the present disclosure further provide an operation method of a memory, as shown in FIG. 15, which may specifically include: S1501: generating an initial calibration code based on a received calibration command; S1502: converting the initial calibration code to a target calibration code of a target adjustment step size; and S1503: calibrating interface impedance of a target semiconductor device based on the target calibration code.

It is noted that, S1501 may include comparing a current voltage with a reference voltage to generate a comparison result in response to the calibration command; and generating the initial calibration code according to the comparison result. The current voltage is a current voltage across the interface impedance of the target semiconductor device.

Generating the initial calibration code according to the comparison result may include sampling the comparison result according to a first clock signal to obtain a control signal; and generating the initial calibration code according to the control signal and a second clock signal.

In some implementations, the target calibration code comprises a first target calibration code and/or a second target calibration code, wherein the adjustment step size of the first target calibration code is greater than or equal to the adjustment step size of the initial calibration code, and the adjustment step size of the second target calibration code is less than or equal to the adjustment step size of the initial calibration code.

In some implementations, converting the initial calibration code to the target calibration code of the target adjustment step size includes generating a code adjustment signal according to a most significant bit of the initial calibration code; and converting the initial calibration code to the target calibration code based on the code adjustment signal, the target calibration code comprising a first target calibration code or a second target calibration code.

In some implementations, the method further includes receiving a latch command; and outputting the corresponding target calibration code upon the completion of this calibration based on the latch command. The latch command is generated when the corresponding target calibration code upon the completion of this calibration is not the same as the corresponding target calibration code upon the completion of a previous calibration.

In some implementations, the target calibration code comprises a pull-up target calibration code, and outputting the corresponding target calibration code upon the completion of this calibration includes temporarily storing the corresponding pull-up target calibration code upon the completion of this calibration; and receiving a first latch sub-command included in the latch command, and outputting the corresponding pull-up target calibration code upon the completion of this calibration based on the first latch sub-command. The first latch sub-command is generated when the corresponding pull-up target calibration code upon the completion of this calibration is not the same as the corresponding pull-up target calibration code upon the completion of the previous calibration.

In some implementations, the target calibration code comprises a pull-down target calibration code, and outputting the corresponding target calibration code upon the completion of this calibration further includes temporarily storing the corresponding pull-down target calibration code upon the completion of this calibration; and receiving a second latch sub-command included in the latch command, and outputting the corresponding pull-down target calibration code upon the completion of this calibration based on the second latch sub-command, wherein the second latch sub-command is generated when the corresponding pull-down target calibration code upon the completion of this calibration is not the same as the corresponding pull-down target calibration code upon the completion of the previous calibration.

It is to be noted that, the operation method of the memory provided by the implementations of the present disclosure is achieved based on the aforementioned ZQ calibration circuit provided by the implementations of the present disclosure, and the terms appearing in the operation method have been described in detail when describing the ZQ calibration circuit in the foregoing description, may be referred to the foregoing description, and will not be repeated here.

The operation method of the memory provided by the implementations of the present disclosure converts the initial calibration code to the target calibration code of the target adjustment step size, and uses the target calibration code to calibrate the interface impedance of the target semiconductor device so as to shorten the calibration time or improve the calibration precision and meet the ZQ calibration in different demand scenarios.

Figure 16:
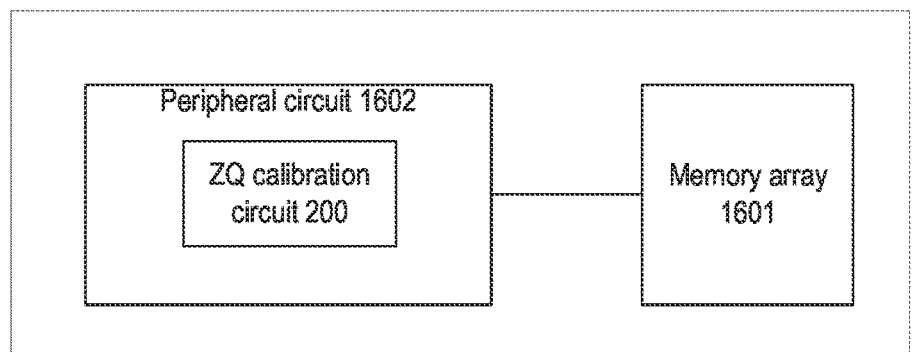
FIG. 16 shows a schematic structural diagram of a memory provided by implementations of the present disclosure.

Implementations of the present disclosure further provide a memory 160, which, as shown in FIG. 16, comprises: a memory array 1601 configured to store data; and a peripheral circuit 1602 that couples to the memory array 1601 and comprises a ZQ calibration circuit 200, wherein the ZQ calibration circuit 200 comprises a logic control circuit and a calibration circuit. The logic control circuit comprises a calibration code generation circuit and a mapping conversion circuit, wherein the calibration code generation circuit is configured to generate an initial calibration code in response to a calibration command, and the mapping conversion circuit is configured to control the calibration code generation circuit to convert the initial calibration code to a target calibration code of a target adjustment step size in response to a code adjustment signal. The calibration circuit is configured to calibrate interface impedance of a target semiconductor device based on the target calibration code.

In some implementations, the memory array is a three-dimensional NAND memory array.

Figure 17:
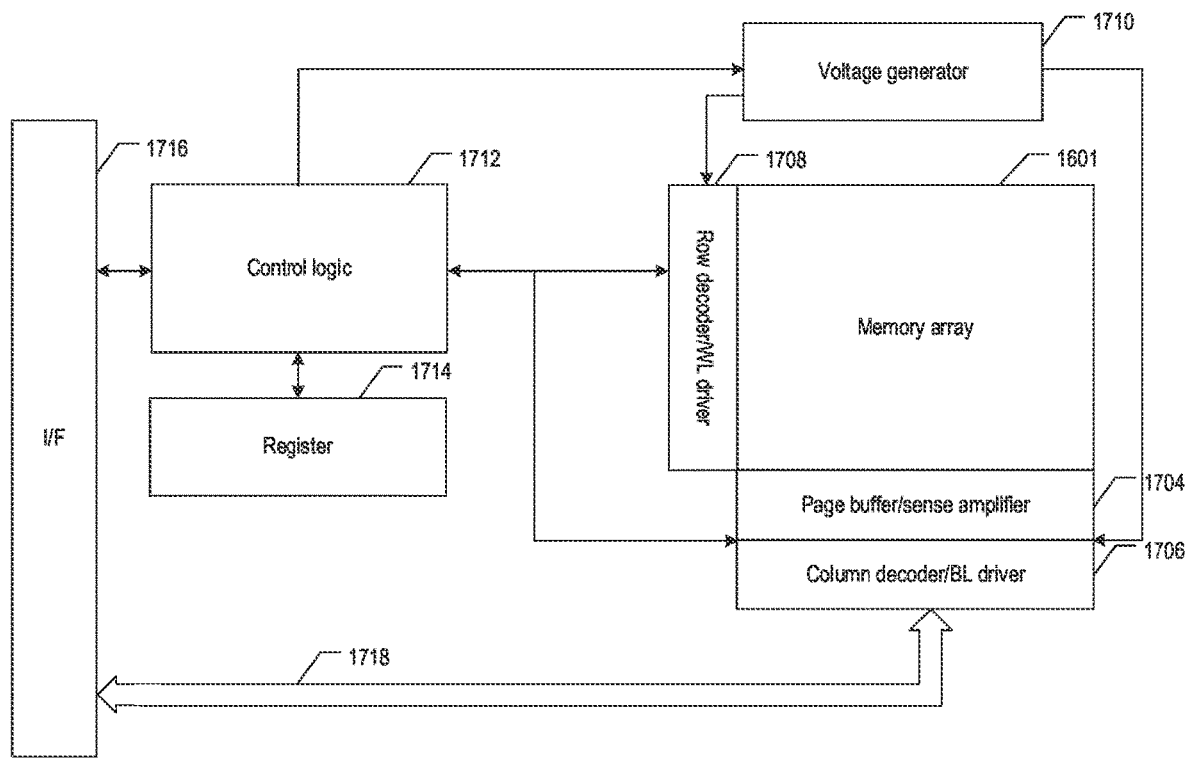
FIG. 17 shows a schematic structural diagram of a memory including a peripheral circuit provided by implementations of the present disclosure.

It is to be noted that, the memory 160 provided by the implementations of the present disclosure comprises a memory array 1601 and a peripheral circuit 1602, wherein the peripheral circuit 1602 may comprise various types of peripheral circuits formed using a metal-oxide-semiconductor (MOS) technology. For example, FIG. 17 illustrates some exemplary peripheral circuits. The peripheral circuit 1602 comprises a page buffer/sense amplifier 1704, a column decoder/bit line driver 1706, a row decoder/word line driver 1708, a voltage generator 1710, a control logic 1712, a register 1714, an interface 1716 and a data bus 1718. It is understood that in some examples, additional peripheral circuits not shown in FIG. 17 may be included as well.

The page buffer/sense amplifier 1704 may be configured to read and program (write) data from and to the memory array 1601 according to control signals from the control logic 1712. In one example, the page buffer/sense amplifier 1704 may store one page of programming data (writing data) to be programmed into one page of the memory array 1601. In another example, the page buffer/sense amplifier 1704 may perform programming verification operations to ensure that the data has been properly programmed into memory cells coupled to selected word lines. In yet another example, the page buffer/sense amplifier 1704 may also sense a low power signal from the bit lines that represents a data bit stored in the memory cells, and amplify a small voltage swing to a recognizable logic level in a reading operation. The column decoder/bit line driver 1706 may be configured to be controlled by the control logic 1712 and select one or more NAND memory strings by applying bit line voltages generated from the voltage generator 1710.

The row decoder/word line driver 1708 may be configured to be controlled by the control logic 1712 and select/unselect memory blocks of the memory array 1601 and select/unselect word lines of the memory blocks. The row decoder/word line driver 1708 may be further configured to drive word lines using word line voltages generated from the voltage generator 1710. In some implementations, the row decoder/word line driver 1708 is configured to perform erasing operations on the memory cells coupled to (one or more) selected word lines. The voltage generator 1710 may be configured to be controlled by the control logic 1712 and generate a word line voltage (such as, a reading voltage, a programming voltage, a pass voltage, a local voltage, a verification voltage, etc.), a bit line voltage and a source line voltage to be supplied to the memory array 1601.

The control logic 1712 may be coupled to each peripheral circuit described above and configured to control the operations of each peripheral circuit. The register 1714 may be coupled to the control logic 1712 and include a state register, a command register, and an address register for storing state information, command operation codes (OP codes), and command addresses for controlling the operations of each peripheral circuit. The interface 1716 may be coupled to the control logic 1712, and act as a control buffer to buffer and relay control commands received from a host (not shown) to the control logic 1712 and state information received from the control logic 1712 to the host. The interface 1716 may also be coupled to the column decoder/bit line driver 1706 via a data bus 1718 and act as a data I/O interface and a data buffer to buffer and relay the data to and from the memory array 1601.

It is to be noted that, the aforementioned ZQ calibration circuit 200 is also included in the peripheral circuit 1602, wherein the logic control circuit 201 in the ZQ calibration circuit 200 corresponds to the control logic 1712 in the peripheral circuit 1602 in FIG. 17, and circuits, such as the calibration circuit 202 in the ZQ calibration circuit 200, may correspond to the additional peripheral circuits not shown in FIG. 17 in the foregoing description. Here, the function and structure of the ZQ calibration circuit 200 have been described in detail in the foregoing description, and will be no longer repeated here.

Figure 18:
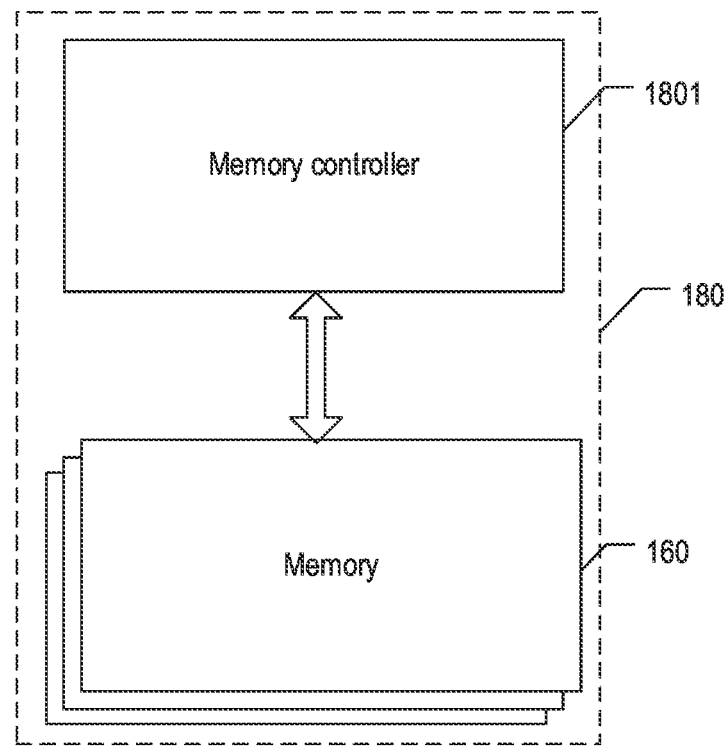
FIG. 18 shows a schematic structural diagram of a memory system provided by implementations of the present disclosure.

Implementations of the present disclosure further provide a memory system 180, which, as shown in FIG. 18, may include at least one memory 160, each of which comprises a memory array configured to store data and a peripheral circuit that couples to the memory array and includes a ZQ calibration circuit. In some implementations, the ZQ calibration circuit may include a logic control circuit and a calibration circuit. In some implementations, the logic control circuit may be a calibration code generation circuit and a mapping conversion circuit. In some implementations, the calibration code generation circuit may be configured to generate an initial calibration code in response to a calibration command. In some implementations, the mapping conversion circuit may be configured to control the calibration code generation circuit to convert the initial calibration code to a target calibration code of a target adjustment step size in response to the code adjustment signal. In some implementations, the calibration circuit may be configured to perform calibration based on the target calibration code. In some implementations, a memory controller 1801 may be coupled to the one or more memories and configured to control the memories.

In some implementations, the memory system is included in a solid-state drive SSD or a memory card.

It is to be noted that the memory system provided by the implementations of the present disclosure comprises the aforementioned memory 160. The memory 160 includes the aforementioned ZQ calibration circuit 200. The function and structure of the ZQ calibration circuit 200 have been described in detail in the foregoing description.

In an actual application process, the memory system 180 may be included in a variety of memory apparatuses. Specifically, as shown in FIGS. 19 and 20, FIG. 19 shows a structural schematic diagram of a memory card provided by implementations of the present disclosure, and FIG. 20 shows a structural schematic diagram of an SSD provided by implementations of the present disclosure.

Figure 19:
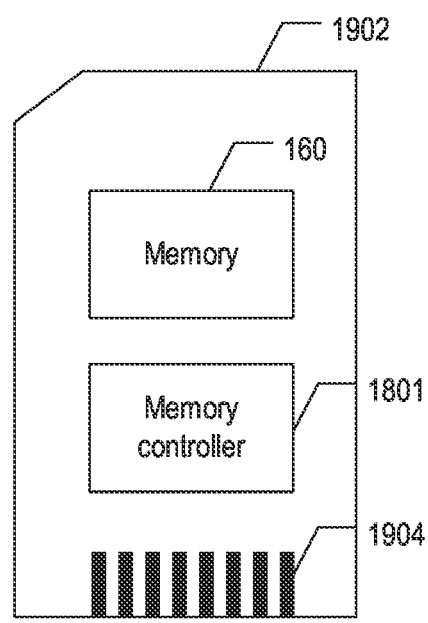
FIG. 19 shows a schematic structural diagram of a memory card including a memory system provided by implementations of the present disclosure.

In FIG. 19, the memory controller 1801 and a memory 160 (e.g., a single memory or more than one memory) may be integrated into the memory card 1902. The memory card may include a PC card (PCMCIA, Personal Computer Memory Card International Association), a CF card, a Smart Media (SM) card, a memory stick, a Multi-media card (MMC, RS-MMC, MMCmicro), an SD card (SD, miniSD, microSD, SDHC), a UFS, etc. The memory card may further comprise a memory card connector 1904 coupling the memory card with the host.

Figure 20:
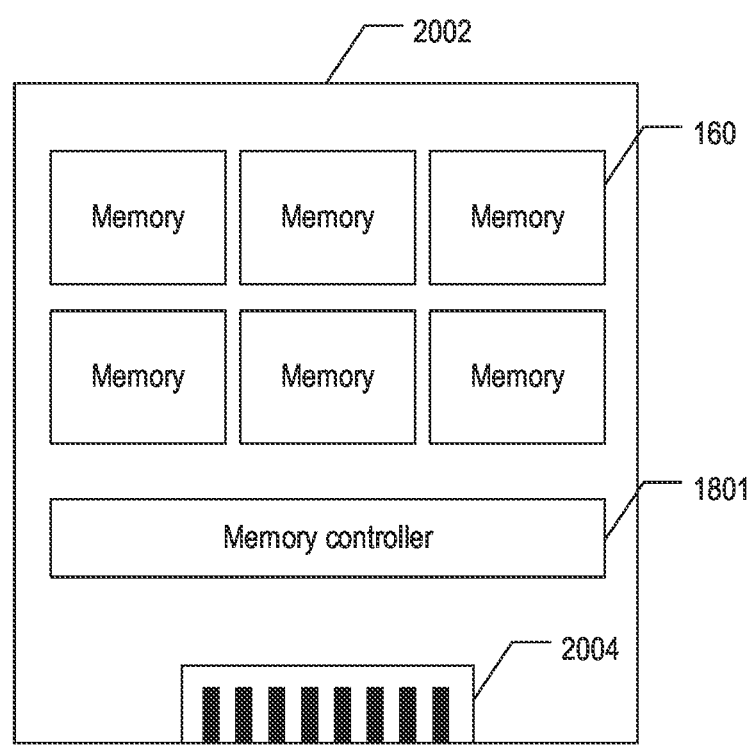
FIG. 20 shows a schematic structural diagram of a solid-state drive (SSD) including a memory system provided by implementations of the present disclosure.

In FIG. 20, the memory controller 1801 and multiple memories 160 may be integrated into the SSD 2002. The SSD may further comprise an SSD connector 2004 coupling the SSD with the host. In some implementations, the storage capacity and/or the operation speed of the SSD are greater than the storage capacity and/or the operation speed of the memory card.

Implementations of the present disclosure further provide an electronic apparatus that includes a memory system. In some implementations, the memory system may include one or more memories, each of which comprises a memory array and a peripheral circuit including a ZQ calibration circuit of any one of the aforementioned structures. In some implementations, the electronic apparatus may include a host coupled to the memory system and configured to control the memory system.

Implementations of the present disclosure further provide a computer readable storage medium on which a computer program is stored. The computer program, when being executed by a processor, can achieve the steps of any one of the above-mentioned methods. The aforementioned storage medium includes various media that can store program codes, such as a mobile storage apparatus, a Read-Only Memory (ROM), a Random Access Memory (RAM), a magnetic disk, or an optical disk, or the like.

It is to be noted that, in several implementations provided by the present disclosure, it should be understood that the disclosed apparatus and method may be implemented by other methods. The apparatus implementations as described above are only illustrative, for example, the division of the units is only a logical functional division, and there may be other manners of division in actual implementation. For instance, a plurality of units or components may be combined, or may be integrated in another system, or some features can be ignored or not performed. In addition, the coupling or direct coupling or communication connection between various constituent parts as shown or as discussed may be implemented through indirect coupling or communication connection of some interfaces, apparatuses or units, and may be electrical, mechanical or other forms.

The above-mentioned units described as separate components may or may not be physically separated. The components shown as units may or may not be physical units, that is, they may be located in one place, or may be distributed onto a plurality of network units. According to actual needs, part or all of the units may be selected for realizing the purposes of the scheme of the implementation.

In addition, various functional units in each implementation of the present disclosure may be all integrated into one processing unit, or each unit may serve as one unit individually, or two or more units may be integrated into one unit. The above-mentioned integrated unit may be implemented in a form of hardware or in a form of hardware and software functional units.

Those of ordinary skill in the art may understand that all or part of the steps of the above-mentioned method implementations may be completed by a program instruction related hardware. The aforementioned program may be stored in a computer-readable storage medium, and the steps including the above-mentioned method implementations are performed when the program is executed; and the aforementioned storage medium includes various media that can store program codes, such as a mobile storage device, a Read-Only Memory (ROM), a Random Access Memory (RAM), a magnetic disk, or an optical disk, or the like.

Alternatively, the above-mentioned integrated unit of the present disclosure, if being implemented in a form of a software functional module and serving as an individual product for sales or use, may also be stored in a computer readable storage medium. Based on such understanding, the technical solutions of the implementations of the present disclosure may be essentially embodied in a form of a software product; or in other words, a portion thereof contributing to certain devices may be embodied in a form of a software product. The computer software product is stored in a storage medium, including several instructions to make a computer apparatus (which may be a personal computer, a server, or a network apparatus, or the like) to execute all or part of the method of various implementations of the present disclosure. The aforementioned storage medium includes media that can store program codes, such as a mobile storage apparatus, a ROM, a RAM, a magnetic disk, or an optical disk, or the like.

The above descriptions are intended to be illustrative rather than restrictive. For example, the above-mentioned instances (or one or more aspects thereof) may be combined with each other for use. Other implementations may be used, such as those that one of ordinary skill in the art can use when reading the above description. It should be understood that it will not be used to explain or limit the scope or meaning of the claims. In addition, in the above detailed description, various features may be combined together to simplify the present disclosure. This should not be construed to mean that the disclosed features that are not claimed are essential to any claim. Instead, the subject matter of the disclosure may be less than all features of a particular disclosed implementation. Thus, the appended claims are hereby incorporated into the detailed description, with each claim standing on its own as a separate implementation, and it is expected that these implementations can be combined with each other in various combinations or replacements. The scope of the present disclosure should be determined with reference to the appended claims, along with the full scope of equivalents to which such claims are entitled.

What is claimed is:

1. A circuit for ZQ calibration, comprising:
a logic control circuit, comprising:
a calibration code generation circuit configured to generate an initial calibration code in response to a calibration command; and
a mapping conversion circuit configured to control the calibration code generation circuit to convert the initial calibration code to a target calibration code of a target adjustment step size in response to a code adjustment signal, wherein the mapping conversion circuit includes a multiplexer (MUX), and wherein the MUX is configured to control the calibration code generation circuit to convert the initial calibration code to the target calibration code in response to the code adjustment signal; and
a calibration circuit configured to calibrate interface impedance of a target semiconductor device based on the target calibration code.

2. The circuit of claim 1, wherein:
the code adjustment signal includes one or more of a first adjustment sub-signal or a second adjustment sub-signal,
the mapping conversion circuit includes one or more of a first conversion sub-circuit or a second conversion sub-circuit,
the first conversion sub-circuit is configured to control the calibration code generation circuit to convert the initial calibration code to a first target calibration code in response to the first adjustment sub-signal,
an adjustment step size of the first target calibration code is greater than or equal to an adjustment step size of the initial calibration code,
the second conversion sub-circuit is configured to control the calibration code generation circuit to convert the initial calibration code to a second target calibration code in response to the second adjustment sub-signal, and
an adjustment step size of the second target calibration code is less than or equal to the adjustment step size of the initial calibration code.

3. The circuit of claim 1, wherein:
the target calibration code includes a first target calibration code or a second target calibration code, and
the code adjustment signal is generated based on a most significant bit of the initial calibration code.

4. The circuit of claim 1, wherein:
the calibration code generation circuit includes a comparator and a counter,
the comparator is configured to:
compare a current voltage across the interface impedance of the target semiconductor device with a reference voltage to generate a comparison result in response to the calibration command; and
output the comparison result, and
the counter is connected with the comparator and is configured to:
receive the comparison result; and
generate the initial calibration code according to the comparison result.

5. The circuit of claim 4, wherein:
the calibration code generation circuit further includes a first flip-flop connected between the comparator and the counter,
the first flip-flop is configured to:
receive the comparison result and a first clock signal; and
sample the comparison result based on the first clock signal and output a control signal, and
the counter is further configured to:
receive the control signal and a second clock signal; and
generate the initial calibration code based on the control signal and the second clock signal.

6. The circuit of claim 1, wherein one or more of:
the initial calibration code includes a pull-up calibration code and a pull-down calibration code,
the target calibration code includes a pull-up target calibration code and a pull-down target calibration code, the code adjustment signal includes a pull-up code adjustment signal and a pull-down code adjustment signal, the calibration code generation circuit includes a pull-up code generation sub-circuit and a pull-down code generation sub-circuit, the mapping conversion circuit includes a pull-up conversion sub-circuit and a pull-down conversion sub-circuit, the pull-up code generation sub-circuit is configured to generate the pull-up calibration code in response to the calibration command, the pull-up conversion sub-circuit is configured to control the pull-up code generation sub-circuit to convert the pull-up calibration code to the pull-up target calibration code in response to the pull-up code adjustment signal, the pull-down code generation sub-circuit is configured to generate the pull-down calibration code in response to the calibration command, and the pull-down conversion sub-circuit is configured to control the pull-down code generation sub-circuit to convert the pull-down calibration code to the pull-down target calibration code in response to the pull-down code adjustment signal.

7. The circuit of claim 6, wherein:
the calibration circuit includes a pull-up calibration sub-circuit and a pull-down calibration sub-circuit,
the pull-up calibration sub-circuit is configured to perform pull-up calibration on the interface impedance of the target semiconductor device based on the pull-up target calibration code, and
the pull-down calibration sub-circuit is configured to perform pull-down calibration on the interface impedance of the target semiconductor device based on the pull-down target calibration code.

8. The circuit of claim 7, wherein:
the pull-up calibration sub-circuit includes a pull-up resistor network and a first pull-down resistor network that are connected in series,
the pull-down calibration sub-circuit includes a second pull-down resistor network, and
the pull-up resistor network, the first pull-down resistor network, and the second pull-down resistor network include a plurality of metal-oxide-semiconductor (MOS) transistors connected in parallel.

9. The circuit of claim 1, further comprising:
a code output circuit that is configured to:
receive a latch command; and
output the target calibration code upon a completion of a current calibration based on the latch command,
wherein the latch command is generated when the target calibration code upon the completion of the current calibration is not the same as a previous target calibration code upon the completion of a previous calibration.

10. The circuit of claim 9, wherein:
the code output circuit includes a pull-up code output sub-circuit,
the latch command includes a first latch sub-command,
the target calibration code includes a pull-up target calibration code,
the pull-up code output sub-circuit includes a second flip-flop and a third flip-flop that are connected in series,
the second flip-flop is configured to temporarily store the pull-up target calibration code upon the completion of the current calibration,
the third flip-flop is configured to:
receive the first latch sub-command; and
output the pull-up target calibration code upon the completion of the current calibration based on the first latch sub-command, and
the first latch sub-command is generated when the pull-up target calibration code upon the completion of the current calibration is not the same as the pull-up target calibration code upon the completion of the previous calibration.

11. The circuit of claim 9, wherein:
the code output circuit includes a pull-down code output sub-circuit,
the latch command includes a second latch sub-command,
the target calibration code includes a pull-down target calibration code,
the pull-down code output sub-circuit includes a fourth flip-flop configured to temporarily store the pull-down target calibration code upon the completion of the current calibration, and a fifth flip-flop configured to receive the second latch sub-command and output the pull-down target calibration code upon the completion of the current calibration based on the second latch sub-command, and
the second latch sub-command is generated when the pull-down target calibration code upon the completion of the current calibration is not the same as the pull-down target calibration code upon the completion of the previous calibration.

12. A method of operating a memory, comprising:
generating an initial calibration code based on a received calibration command;
converting the initial calibration code to a target calibration code of a target adjustment step size by generating a code adjustment signal according to a most significant bit of the initial calibration code, and converting the initial calibration code to the target calibration code based on the code adjustment signal; and
calibrating, by a calibration circuit, interface impedance of a target semiconductor device based on the target calibration code.

13. The method of claim 12, wherein:
the target calibration code includes one or more of a first target calibration code or a second target calibration code,
an adjustment step size of the first target calibration code is greater than or equal to an adjustment step size of the initial calibration code, and
an adjustment step size of the second target calibration code is less than or equal to the adjustment step size of the initial calibration code.

14. The method of claim 12, wherein
the target calibration code includes a first target calibration code or a second target calibration code.

15. The method of claim 12, wherein the generating the initial calibration code based on the received calibration command comprises:
comparing a current voltage with a reference voltage to generate a comparison result in response to the received calibration command; and
generating the initial calibration code according to the comparison result,
wherein the current voltage is a current voltage across the interface impedance of the target semiconductor device.

16. The method of claim 15, wherein the generating the initial calibration code according to the comparison result comprises:

sampling the comparison result according to a first clock signal to obtain a control signal; and generating the initial calibration code according to the control signal and a second clock signal.

17. The method of claim 12, further comprising:

receiving a latch command; and outputting the target calibration code upon a completion of a current calibration based on the latch command, wherein the latch command is generated when the target calibration code of the current calibration is not the same as a previous target calibration code of a previous calibration.

18. The method of claim 17, wherein the target calibration code includes a pull-up target calibration code, and wherein the outputting the target calibration code upon the completion of the current calibration based on the latch command comprises:

temporarily storing the pull-up target calibration code upon the completion of the current calibration;

receiving a first latch sub-command included in the latch command; and outputting the pull-up target calibration code upon the completion of the current calibration based on the first latch sub-command, wherein the first latch sub-command is generated when the pull-up target calibration code of a current calibration is not the same as the pull-up target calibration code of the previous calibration.

19. The method of claim 17, wherein the target calibration code includes a pull-down target calibration code, and wherein the outputting the target calibration code upon the completion of the current calibration based on the latch command further comprises:

temporarily storing the pull-down target calibration code upon a completion of a current calibration;

receiving a second latch sub-command included in the latch command; and outputting the pull-down target calibration code upon the completion of the current calibration based on the second latch sub-command, wherein the second latch sub-command is generated when the pull-down target calibration code of the current calibration is not the same as the pull-down target calibration code of the previous calibration.

20. A memory, comprising:

a memory array configured to store data; and a peripheral circuit coupled to the memory array and comprising a ZQ calibration circuit, wherein the ZQ calibration circuit comprises a logic control circuit and a calibration circuit, wherein the logic control circuit comprises a calibration code generation circuit and a mapping conversion circuit, wherein the calibration code generation circuit is configured to generate an initial calibration code in response to a calibration command, wherein the mapping conversion circuit is configured to control the calibration code generation circuit to convert the initial calibration code to a target calibration code of a target adjustment step size in response to a code adjustment signal, wherein the mapping conversion circuit includes a multiplexer (MUX), wherein the MUX is configured to control the calibration code generation circuit to convert the initial calibration code to the target calibration code in response to the code adjustment signal, and wherein the calibration circuit is configured to calibrate interface impedance of a target semiconductor device based on the target calibration code.

* * * * *